United States Patent
Saeki et al.

(10) Patent No.: US 10,431,753 B2
(45) Date of Patent: Oct. 1, 2019

(54) SUBSTRATE FOR DISPLAY, COLOR FILTER USING THE SAME AND METHOD FOR THE PRODUCTION THEREOF, ORGANIC EL ELEMENT AND METHOD FOR THE PRODUCTION THEREOF, AND FLEXIBLE ORGANIC EL DISPLAY

(71) Applicant: TORAY INDUSTRIES, INC., Tokyo (JP)

(72) Inventors: Akinori Saeki, Otsu (JP); Junji Wakita, Otsu (JP); Harushi Nonaka, Otsu (JP); Yoshinori Matoba, Otsu (JP); Masahito Nishiyama, Otsu (JP)

(73) Assignee: Toray Industries, Inc., Tokyo (JP)

( * ) Notice: Subject to any disclaimer, the term of this patent is extended or adjusted under 35 U.S.C. 154(b) by 175 days.

(21) Appl. No.: 15/515,729

(22) PCT Filed: Sep. 25, 2015

(86) PCT No.: PCT/JP2015/077070
§ 371 (c)(1),
(2) Date: Mar. 30, 2017

(87) PCT Pub. No.: WO2016/052323
PCT Pub. Date: Apr. 7, 2016

(65) Prior Publication Data
US 2017/0309844 A1  Oct. 26, 2017

(30) Foreign Application Priority Data
Sep. 30, 2014  (JP) ................. 2014-200266
Sep. 30, 2014  (JP) ................. 2014-200267

(51) Int. Cl.
*H01L 51/00* (2006.01)
*B32B 27/28* (2006.01)
(Continued)

(52) U.S. Cl.
CPC ............ *H01L 51/0097* (2013.01); *B05D 7/04* (2013.01); *B05D 7/24* (2013.01); *B32B 7/02* (2013.01);
(Continued)

(58) Field of Classification Search
CPC ..... B23B 27/20; B23B 27/281; B23B 27/283; B32B 27/281; B32B 27/283; B32B 2264/102
See application file for complete search history.

(56) References Cited

U.S. PATENT DOCUMENTS

2008/0032061 A1* 2/2008 Watanabe ............ C09D 183/06
427/515
2012/0156457 A1  6/2012 Kondo
(Continued)

FOREIGN PATENT DOCUMENTS

JP  2000292635 A  * 10/2000
JP  2005338394 A    12/2005
(Continued)

OTHER PUBLICATIONS

International Search Report and Written Opinion for International Application No. PCT/JP2015/077070, dated Dec. 28, 2015, 10 Pages.
(Continued)

*Primary Examiner* — Vu A Nguyen
(74) *Attorney, Agent, or Firm* — RatnerPrestia

(57) ABSTRACT

The present invention is a substrate for a display, the substrate having a film B including a polysiloxane resin on at least one surface of a film A including a polyimide resin, wherein the film B contains inorganic oxide particles therein, and the present invention has an object to provide a substrate for a display: being able to be applied to a color filter, an organic EL element, or the like without the need to
(Continued)

carry out any complex operations; allowing high-definition displays to be manufactured; and being provided with a low CTE, a low birefringence, and flexibility.

19 Claims, 3 Drawing Sheets

(51) Int. Cl.
| | |
|---|---|
| H01L 27/32 | (2006.01) |
| B05D 7/04 | (2006.01) |
| B05D 7/24 | (2006.01) |
| B32B 7/02 | (2019.01) |
| B32B 27/34 | (2006.01) |
| G02B 5/20 | (2006.01) |
| H01L 51/50 | (2006.01) |
| C08G 73/10 | (2006.01) |
| C08G 73/14 | (2006.01) |
| C08G 77/14 | (2006.01) |
| G02B 5/22 | (2006.01) |
| G03F 7/00 | (2006.01) |
| G03F 7/031 | (2006.01) |
| G03F 7/038 | (2006.01) |
| G03F 7/039 | (2006.01) |
| G03F 7/075 | (2006.01) |
| G03F 7/095 | (2006.01) |
| G03F 7/11 | (2006.01) |
| G03F 7/20 | (2006.01) |
| G03F 7/32 | (2006.01) |
| C09D 179/08 | (2006.01) |
| G03F 7/032 | (2006.01) |
| H01L 51/52 | (2006.01) |
| C08F 283/12 | (2006.01) |
| C08G 77/00 | (2006.01) |
| G03F 7/09 | (2006.01) |
| G03F 7/16 | (2006.01) |
| B05D 3/04 | (2006.01) |
| B05D 7/00 | (2006.01) |
| B05D 1/00 | (2006.01) |
| B05D 3/02 | (2006.01) |
| C08G 77/20 | (2006.01) |
| G03F 7/033 | (2006.01) |

(52) U.S. Cl.
CPC .......... *B32B 27/34* (2013.01); *C08F 283/124* (2013.01); *C08G 73/106* (2013.01); *C08G 73/1007* (2013.01); *C08G 73/1039* (2013.01); *C08G 73/1042* (2013.01); *C08G 73/1046* (2013.01); *C08G 73/1053* (2013.01); *C08G 73/1071* (2013.01); *C08G 73/1075* (2013.01); *C08G 73/1082* (2013.01); *C08G 73/14* (2013.01); *C08G 77/14* (2013.01); *C09D 179/08* (2013.01); *G02B 5/20* (2013.01); *G02B 5/223* (2013.01); *G03F 7/0007* (2013.01); *G03F 7/0035* (2013.01); *G03F 7/031* (2013.01); *G03F 7/032* (2013.01); *G03F 7/038* (2013.01); *G03F 7/039* (2013.01); *G03F 7/0752* (2013.01); *G03F 7/0757* (2013.01); *G03F 7/0955* (2013.01); *G03F 7/11* (2013.01); *G03F 7/2004* (2013.01); *G03F 7/2022* (2013.01); *G03F 7/322* (2013.01); *H01L 27/322* (2013.01); *H01L 51/003* (2013.01); *H01L 51/004* (2013.01); *H01L 51/0034* (2013.01); *H01L 51/0043* (2013.01); *H01L 51/0094* (2013.01); *H01L 51/50* (2013.01); *H01L 51/5284* (2013.01); *B05D 1/005* (2013.01); *B05D 3/0254* (2013.01); *B05D 3/0466* (2013.01); *B05D 7/546* (2013.01); *B05D 2451/00* (2013.01); *C08G 77/20* (2013.01); *C08G 77/80* (2013.01); *G03F 7/033* (2013.01); *G03F 7/094* (2013.01); *G03F 7/162* (2013.01); *G03F 7/168* (2013.01); *H01L 2251/5338* (2013.01); *Y02E 10/549* (2013.01)

(56) References Cited

U.S. PATENT DOCUMENTS

2014/0162035 A1* 6/2014 Yamamoto ................ B32B 7/02
428/213
2015/0183932 A1 7/2015 Katayama et al.

FOREIGN PATENT DOCUMENTS

| JP | 2006063133 A | 3/2006 |
|---|---|---|
| JP | 2008045054 A | 2/2008 |
| JP | 2008107766 A | 5/2008 |
| JP | 2010100674 A | 5/2010 |
| JP | 2011111596 A | 6/2011 |
| JP | 2012146905 A | 8/2012 |
| JP | 2013060005 A | 4/2013 |
| JP | 2013157228 A | 8/2013 |
| JP | 2014026969 A | 2/2014 |
| JP | 2014046463 A | 3/2014 |
| JP | 2014151496 A | 8/2014 |
| WO | 2011024690 A1 | 3/2011 |

OTHER PUBLICATIONS

Singapore International Search Report with Written Opinion for International Application No. 11201702467Q, dated Mar. 21, 2018, 9 pages.

* cited by examiner

[Figure 1]
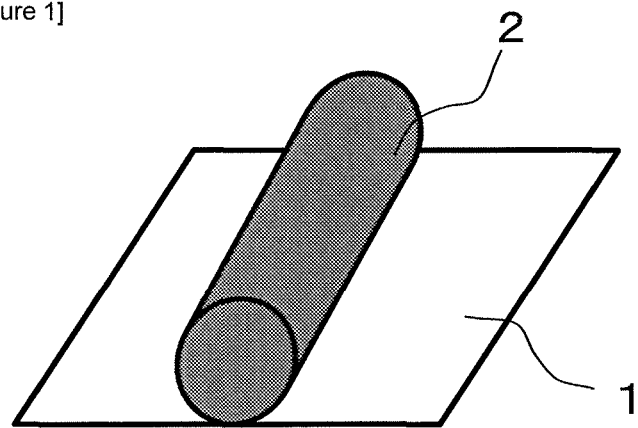
[Figure 2]
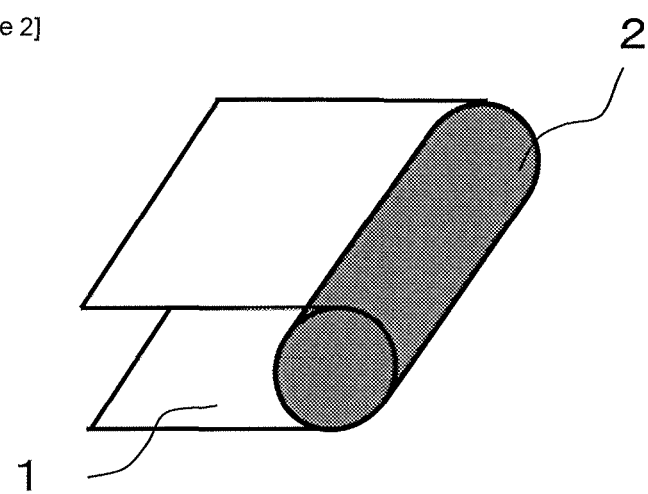

[Figure 3]
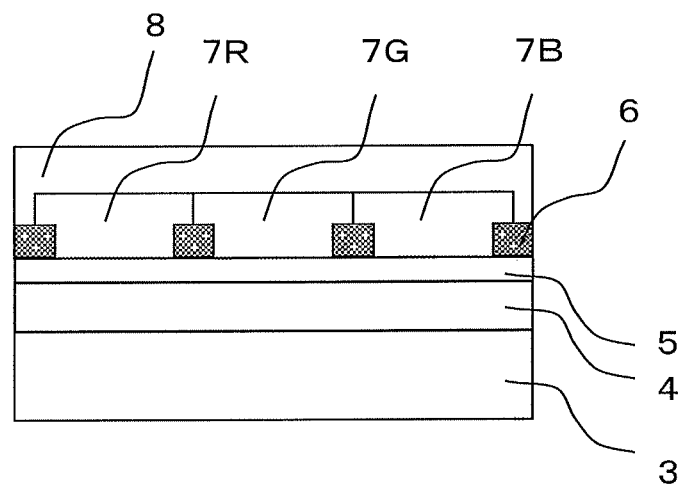
[Figure 4]
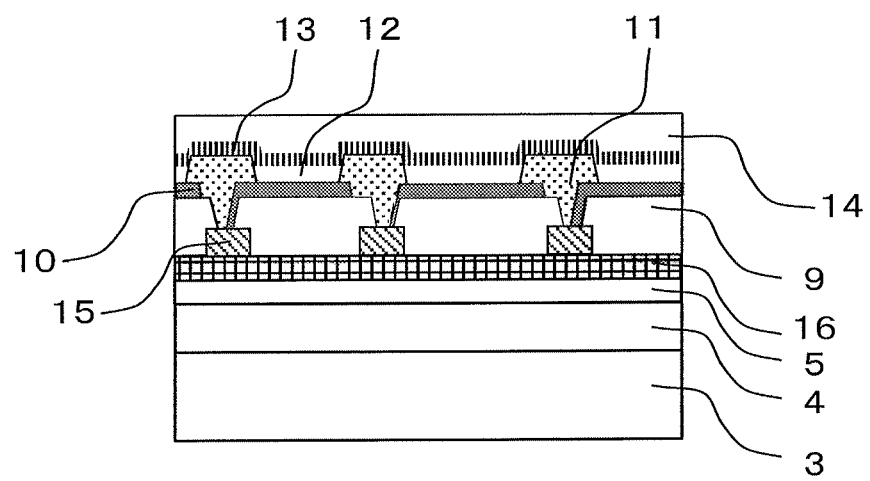

[Figure 5]
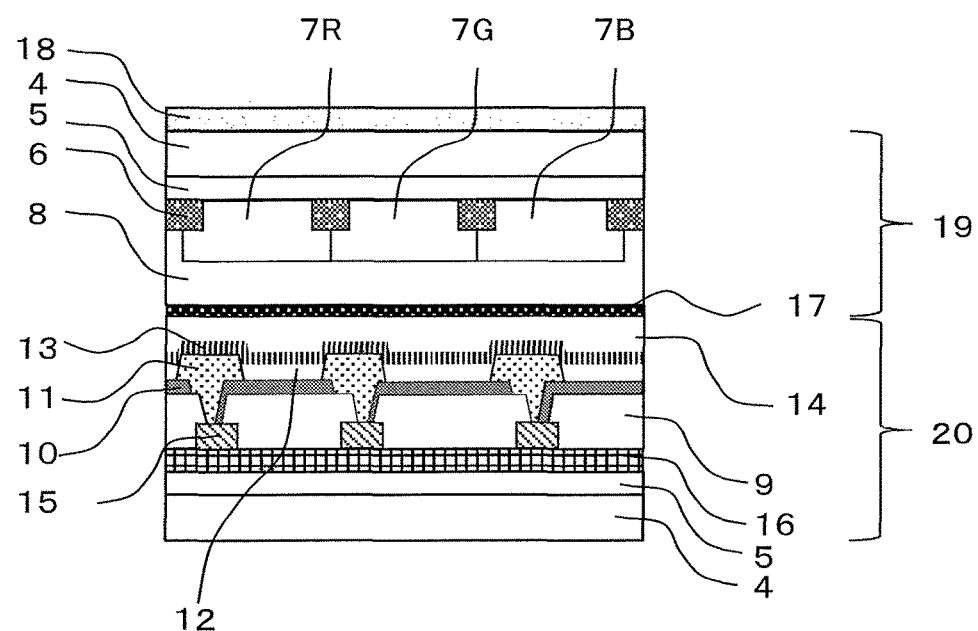

SUBSTRATE FOR DISPLAY, COLOR FILTER USING THE SAME AND METHOD FOR THE PRODUCTION THEREOF, ORGANIC EL ELEMENT AND METHOD FOR THE PRODUCTION THEREOF, AND FLEXIBLE ORGANIC EL DISPLAY

CROSS REFERENCE TO RELATED APPLICATIONS

This is the U.S. National Phase application of PCT/JP2015/077070, filed Sep. 25, 2015, which claims priority to Japanese Patent Application No. 2014-200266, filed Sep. 30, 2014, and Japanese Patent Application No. 2014-200267, filed Sep. 30, 2014, the disclosures of each of these applications being incorporated herein by reference in their entireties for all purposes.

FIELD OF THE INVENTION

The present invention relates to a substrate for a display, a color filter using the same and a method for the production thereof, an organic EL element and a method for the production thereof, and a flexible organic EL display.

BACKGROUND OF THE INVENTION

Organic films are advantageous in that they are more flexible, less prone to rupture, and lighter in weight as compared with glass. Recently, there are increasing studies to render displays more flexible by forming substrates of flat display panels from organic films.

Generally, examples of the resin to be used for an organic film include polyester, polyamide, polyimide, polycarbonate, polyethersulfone, acrylic resin, and epoxy resin. Especially, since polyimide has higher thermal resistance than that of other resins and has both superior mechanical characteristics, such as high mechanical strength, abrasion resistance, dimensional stability and chemical resistance, and superior electric characteristics, such as insulation property, flexible substrates using polyimide films are under development.

Examples of flexible substrates include substrates for displays, such as a flexible TFT (Thin Film Transistor) substrate, a flexible organic EL element substrate, and a flexible color filter substrate. Color filters are members required in order to make an organic electro-luminescence display device or a liquid crystal display device each using white light as a light source perform color display. Three-color color filters in which three-color colored pixels, namely, red colored pixels, green colored pixels and blue colored pixels, are patterned minutely are common. In a three-color color filter, white color is produced by additive color mixing of colored pixels of three colors: red, green, and blue.

The flat panel display substrate and the color filter substrate enumerated above are required to be high in light transmission in the visible region. In order to prevent aggravation of alignment accuracy caused by heating at the time of forming a display element and a light receiving device such as a TFT and a color filter, the substrates are required to be low in coefficient of thermal expansion (CTE) and not to suffer from warpage. Moreover, in order to prevent color shift when viewed at an angle or to suppress ambient light reflection when using a circular polarizing film, the substrates are required to be low in birefringence.

As a transparent polyimide that exhibits a high light transmission in the visible region, there have been disclosed polyimides made from a fluorine-containing and/or alicyclic acid dianhydride and a fluorine-containing and/or alicyclic diamine (see, for example, PLTs 1 to 4).

Moreover, as a method for producing an organic EL device that exhibits small warpage even if there is a large difference in CTE, there has been disclosed a method of suppressing warpage of a substrate by laminating a shape-retaining layer on the side opposite from a higher CTE layer laminated on a lower CTE layer to offset the stresses generated on both sides of the lower CTE layer (see, for example, PLT 5). Furthermore, as a flexible substrate that attains both a low CTE and a low birefringence, there has been disclosed a polyimide produced by a specific method using a specific acid dianhydride and a specific diamine. (See, for example, PLT 6.)

SUMMARY OF THE INVENTION

When a transparent substrate is formed using a polyimide resin such as those disclosed in PLTs 1 to 4, the CTE indicates a value as large as 50 ppm/° C. or more. If a TFT or a color filter is produced using such a polyimide resin, warpage generates in a substrate to deteriorate alignment accuracy, leading to a problem that it is difficult to produce a high-definition display.

When producing an organic EL element using such a polyimide resin, it is common to form an oxide or a nitride of silicon as a gas barrier film on the polyimide. Generally, the CTE of an oxide and a nitride of silicon is as low as about 3.5 ppm/° C. Accordingly, in such a case, there is, in addition to the problem described above, another problem that cracks or wrinkles are formed in a gas barrier film during a future heating step from the difference in CTE between the polyimide resin and the gas barrier film and an organic EL element tends to degrade.

Moreover, for suppressing the warpage of a substrate in a method such as that disclosed in PLT 5, there is a problem that an operation to stick a shape-retaining layer to a lower CTE layer via an adhesive layer is required and, as a result, the production process becomes complicated.

In PLT 6 is disclosed a method for obtaining a polyimide film that attains both a low CTE and a low birefringence using a specific acid anhydride and a specific diamine by a specific technique, but there is a problem that freedom in monomer design is a little reduced due to limitation in the type of monomer. While low molecular weight compounds (an imidating agent, a dehydration catalyst) is used for chemical imidization, these compounds cause degassing in the heating process in the module production, which may generate a defect.

In view of the above problems, it is an object of the present invention to provide a substrate for a display: being able to be applied to a color filter, an organic EL element, or the like without the need to carry out any complex operations; allowing high-definition displays to be manufactured; and being provided with a low CTE, a low birefringence, and flexibility.

That is, the present invention provides a substrate for a display, the substrate having a film B including a polysiloxane resin on at least one surface of a film A including a polyimide resin, wherein the film B contains inorganic oxide particles therein.

According to the present invention, it is possible to provide a substrate for a display: being able to be applied to a color filter, an organic EL element, or the like without the need to carry out any complex operations; allowing high-definition displays to be manufactured; and being provided with a low CTE, a low birefringence, and flexibility.

BRIEF DESCRIPTION OF DRAWINGS

FIG. 1 is a schematic perspective view showing the execution of evaluation of the flex resistance of a color filter.

FIG. 2 is a schematic perspective view showing the execution of evaluation of the flex resistance of a color filter.

FIG. 3 is a cross-sectional view showing an example of a color filter.

FIG. 4 is a cross-sectional view showing an example of an array of organic EL elements.

FIG. 5 is a cross-sectional view showing an example of a flexible organic EL display.

DETAILED DESCRIPTION OF EMBODIMENTS OF THE INVENTION

The following will describe modes for carrying out the present invention in detail. Note that the present invention is not limited to the following embodiments and may be varied within the scope of its features.

The present invention provides a substrate for a display, the substrate having a film B including a polysiloxane resin on at least one surface of a film A including a polyimide resin, wherein the film B contains inorganic oxide particles therein.

Hereinafter, a structural body having a film B containing a polysiloxane resin on at least one surface of a film A containing a polyimide resin, which is to be used for the substrate for a display of the present invention, is referred to as a "resin stack."

The substrate for a display as referred to herein shall include not only a substrate that supports a display itself but all substrates to be used for members that constitute a display. Examples thereof include a substrate for a color filter having a black matrix and a colored pixel, a substrate for an organic EL element having a TFT, an electrode, an organic layer, etc., a substrate for an electronic paper having an electrode, an ink layer, etc., a substrate for a plasma display having an electrode, a phosphor, etc., an on-chip type substrate in which a color filter is formed directly on an organic EL element, a substrate for an encapsulation resin having a gas barrier film on a resin stack, a substrate for a touch screen having a transparent conductive layer on at least one surface of a resin stack, a substrate for a touch device having a transparent conductive layer on at least one surface of a resin stack, a substrate for a circuit in which a certain circuit is formed on a resin stack, a substrate for a liquid crystal display having a liquid crystal layer on at least one surface of a resin stack, a substrate for an LED display having an LED element on at least one surface of a resin stack, and a substrate for a see-through display through which the rear side of the screen can be seen.

Since the substrate for a display in an aspect of the present invention has a film containing a polysiloxane resin (film B) on at least one surface of a film containing a polyimide resin (film A) and the film containing the polysiloxane resin contains inorganic oxide particles, it is possible to reduce CTE as a stack even if the CTE of a polyimide is large. The coefficient of thermal expansion of the substrate for a display is preferably 40 ppm/° C. or less; in this case, when forming a color filter or forming a gas barrier layer in order to form an organic EL element on a side opposite from the side in contact with the substrate for a display, as described later, it is possible to produce a high-definition color filter or an organic EL element with suppressed degradation of the element without deterioration in processing accuracy or crack generation in the gas barrier layer.

When the birefringence of the film A is denoted by $\Delta N_A$ and the birefringence of the film B is denoted by $\Delta N_B$, it is preferred that $(\Delta N_A - \Delta N_B) \leq 0.065$. In this case, when attempting to prevent ambient light reflection using a circular polarizing film, for example, it is possible to suppress reflection advantageously and it is also possible to improve the visibility of a display.

While the thickness of the resin stack in the present invention is not particularly limited, it is preferred that the thickness ratio of the film A to the film B, film A/film B, be from 25/1 to 1.5/1. Especially, it is more preferred that film A/film B be from 10/1 to 5/3. Because of the thickness ratio of the layers being within the above range, it is possible to maintain the flexibility of a substrate for a display and simultaneously further reduce CTE.

As to the thickness of individual layers, the thickness of the film A is preferably 5.0 μm to 20 μm and the thickness of the film B is preferably 0.2 μm to 3.0 μm from the viewpoint of transparency and low CTE property. From the viewpoint of transparency, the overall thickness of the stack is preferably 5.0 μm to 20 μm.

The thickness of the film A is more preferably 5.0 μm to 15 μm, even more preferably 5 μm to 10 μm. Within the above range, the transmitted color tone of a substrate of a display is better. More preferably, the thickness of the film B is 0.4 μm or more in lower limit and is 2.0 μm or less in upper limit. Within the above thickness range, it is possible to produce a resin film stack that is lower in CTE, free from warpage of its substrate, and particularly superior in transparency and crack resistance.

The thickness of the film can be measured by observing a cross section of the film with a scanning electron microscope (SEM). In the present invention, the thickness of each layer is measured at five measurement points defined at 1-mm intervals along the cross-sectional direction of the stack and the average of the measurements is taken as the thickness of each of the layers.

Although the transparency of the resin stack in the present invention is not particularly limited, it is preferred that the resin stack be transparent when a substrate is required to have transparency as in a color filter or a see-through display. The term transparent as used herein means that the visible light transmittance at a wavelength of 400 nm is 65% or more in the resin stack. Because of being transparent in the visible region, the resin stack can be used effectively for a flexible display substrate or the like which are required to have high transparency. More preferably, the visible light transmittance at the wavelength of 400 nm is 75% or more. The visible light transmittance can be measured using an ultraviolet-visible spectrophotometer after forming a resin film stack of the present invention on a glass substrate.

<Polyimide Resin>

The polyimide resin contained in the film A in the present invention is not particularly limited, and generally, polyimide resin represented by the following formula (11) can be used. This can be prepared by, for example, making a polyimide precursor resin represented by the following formula (12) to undergo imide cyclization (imidization reaction). The method of imidization reaction is not particularly limited and may be heat imidization or chemical imidization. Especially, heat imidization is preferred from the viewpoint of the thermal resistance and the transparency in the visible region of a polyimide resin film.

[Chemical Formula 1]

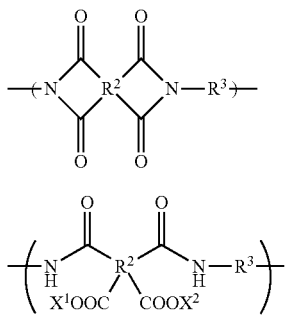

In formulae (11) and (12), $R^2$ represents a tetravalent organic group and $R^3$ represents a divalent organic group. $X^1$ and $X^2$ each independently represent a hydrogen atom, a monovalent organic group having 1 to 10 carbon atoms, or a monovalent alkylsilyl group having 1 to 10 carbon atoms.

Polyimide precursor resins such as a polyamic acid, a polyamic acid ester, and polyamic acid silyl ester can be synthesized through a reaction between a diamine compound and an acid dianhydride or a derivative thereof. Examples of the derivative include a tetracarboxylic acid of that acid dianhydride, a mono, di, tri or tetraester of the tetracarboxylic acid, and acid chlorides, and specifically, structures esterified with a methyl group, an ethyl group, a n-propyl group, an isopropyl group, an n-butyl group, a sec-butyl group, a tert-butyl group, or the like are enumerated. The reaction method of a polymerization reaction is not particularly limited as long as a desired polyimide precursor resin can be produced thereby, and known reaction methods can be used.

A specific reaction method may be a method comprising charging prescribed amounts of all diamine components and solvent to dissolve in a reactor vessel, then charging a prescribed amount of an acid dianhydride component, and stirring them at a temperature of room temperature to 80° C. for a time of 0.5 to 30 hours.

The acid dianhydride and the diamine to be used for the synthesis of a polyimide precursor resin may be those known in the art.

The acid dianhydride is not particularly limited and examples thereof include an aromatic acid dianhydride, an alicyclic acid dianhydride, or an aliphatic acid dianhydride.

Examples of the aromatic acid dianhydride include, but are not limited to, 4,4'-oxydiphthalic anhydride, pyromellitic acid dianhydride, 3,3',4,4'-biphenyltetracarboxylic dianhydride, 2,2-bis(4-(3,4-dicarboxyphenoxy)phenyl)propane dianhydride, 2,3,3',4'-biphenyltetracarboxylic dianhydride, 2,2',3,3'-biphenyltetracarboxylic dianhydride, 3,3',4,4'-terphenyltetracarboxylic dianhydride, 3,3',4,4'-oxyphthalic dianhydride, 2,3,3',4'-oxyphthalic dianhydride, 2,3,2',3'-oxyphthalic dianhydride, diphenylsulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,4-(3,4-dicarboxyphenoxy)benzene dianhydride, bis(1,3-dioxo-1,3-dihydroisobenzfuran-5-carboxylic acid)1,4-phenylene-2,2-bis(4-(4-aminophenoxy)phenyl)propane, 1,2,5,6-naphthalenetetracarboxylic dianhydride, 2,3,6,7-naphthalenetetracarboxylic dianhydride, 9,9-bis(3,4-dicarboxyphenyl)fluorene dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoropyromellitic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)biphenyl dianhydride, 2,2'-bis[(dicarboxyphenoxy)phenyl]propane dianhydride, 2,2'-bis[(dicarboxyphenoxy)phenyl]hexafluoropropane dianhydride, 9,9'-bis(3,4-dicarboxyphenyl)fluorene dianhydride, and acid dianhydride compounds obtained by introducing an alkyl group, an alkoxy group, a halogen atom or the like into the aromatic rings of the foregoing.

Examples of the alicyclic acid dianhydride include, but are not limited to, 1,2,3,4-cyclobutanetetracarboxylic dianhydride, 1,2,4,5-cyclohexanetetracarboxylic dianhydride, 1,2,3,4-cyclopentanetetracarboxylic dianhydride, 1,2,3,4-tetramethyl-1,2,3,4-cyclobutanetetracarboxylic dianhydride, 1,2-dimethyl-1,2,3,4-cyclobutanetetracarboxylic dianhydride, 1,3-dimethyl-1,2,3,4-cyclobutanetetracarboxylic dianhydride, 1,2,3,4-cycloheptanetetracarboxylic dianhydride, 2,3,4,5-tetrahydrofurantetracarboxylic dianhydride, 3,4-dicarboxy-1-cyclohexylsuccinic dianhydride, 2,3,5-tricarboxycyclopentylacetic dianhydride, 3,4-dicarboxy-1,2,3,4-tetrahydro-1-naphthalenesuccinic dianhydride, bicyclo[3,3,0]octane-2,4,6,8-tetracarboxylic dianhydride, bicyclo[4,3,0]nonane-2,4,7,9-tetracarboxylic dianhydride, bicyclo[4,4,0]decane-2,4,7,9-tetracarboxylic dianhydride, bicyclo[4,4,0]decane-2,4,8,10-tetracarboxylic dianhydride, tricyclo[6,3,0,0<2,6>]undecane-3,5,9,11-tetracarboxylic dianhydride, bicyclo[2,2,2]octane-2,3,5,6-tetracarboxylic dianhydride, bicyclo[2,2,2]oct-7-ene-2,3,5,6-tetracarboxylic dianhydride, bicyclo[2,2,1]heptanetetracarboxylic dianhydride, bicyclo[2,2,1]heptane-5-carboxymethyl-2,3,6-tricarboxylic dianhydride, 7-oxabicyclo[2,2,1]heptane-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexanetetracarboxylic dianhydride, 3,3',4,4'-oxydicyclohexanetetracarboxylic dianhydride, 5-(2,5-dioxotetrahydro-3-furanyl)-3-methyl-3-cyclohexene-1,2-dicarboxylic anhydride, and "RIKACID" (registered trademark) BT-100 (trade name, produced by New Japan Chemical Co., Ltd.), derivatives of the foregoing, and dianhydride compounds obtained by introducing an alkyl group, an alkoxy group, a halogen atom, or the like into alicyclic rings of the foregoing.

Examples of the aliphatic dianhydride include, but are not limited to, 1,2,3,4-butanetetracarboxylic dianhydride, 1,2,3,4-pentanetetracarboxylic dianhydride, and derivatives thereof.

Such aromatic acid dianhydrides, alicyclic acid dianhydrides, or aliphatic acid dianhydride can be used either individually or in combination.

Among these, it is preferred from the viewpoint of being marketed and being easily available and the viewpoint of reactivity to use pyromellitic acid dianhydride, 3,3',4,4'-biphenyltetracarboxylic dianhydride, 3,3',4,4'-oxyphthalic dianhydride, 2,2-bis(3,4-dicarboxyphenyl)hexafluoropropane dianhydride, 2,2'-bis[(dicarboxyphenoxy)phenyl]propane dianhydride, 2,3,6,7-naphthalenetetracarboxylic dianhydride, 1,2,4,5-cyclohexanetetracarboxylic dianhydride, 3,3',4,4'-dicyclohexanetetracarboxylic dianhydride, 1,2,3,4- cyclobutanetetracarboxylic dianhydride, 4,4'-oxydiphthalic anhydride, or 2,2-bis(4-(3,4-dicarboxyphenoxy)phenyl)propane dianhydride.

The diamine is not particularly limited and examples thereof include an aromatic diamine compound, an alicyclic diamine compound, or an aliphatic diamine compound.

Examples of the aromatic diamine compound include, but are not limited to, 3,4'-diaminodiphenyl ether, 4,4'-diaminodiphenyl ether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzidine, 2,2'-bis(trifluoromethyl)benzidine, 3,3'-bis(trifluoromethyl)benzidine, 2,2'-dimethylbenzidine, 3,3'-dimethylbenzidine, 2,2',3,3'-tetramethylbenzidine, 2,2'-dichlorobenzidine, 3,3'-dichlorobenzidine, 2,2',3,3'-tetrachlorobenzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis[4-(3-aminophenoxy)phenyl] sulfone, bis(4-aminophenoxy)biphenyl, bis{4-(4-aminophenoxy)phenyl} ether, 1,4-bis(4-aminophenoxy)benzene, 9,9-bis(4-aminophenyl)fluorene, 2,2'-bis[3-(3-aminobenzamide)-4-hydroxyphenyl]hexafluoropropane, 2,2-bis(3-amino-4-hydroxyphenyl)hexafluoropropane, 4-aminophenyl-4-aminobenzenesulfonate, 3-aminophenyl-4-aminobenzenesulfonate, 1,4-phenylene-bis(4-aminobenzenesulfonate), and diamine compounds obtained by introducing an alkyl group, an alkoxy group, a halogen atom or the like into the aromatic rings of the foregoing.

Examples of the alicyclic diamine compound include, but are not limited to, cyclobutanediamine, isophoronediamine, bicyclo[2,2,1]heptanebismethylamine, tricyclo[3,3,1,1,3,7] decane-1,3-diamine, 1,2-cyclohexyldiamine, 1,3-cyclohexyldiamine, 1,4-cyclohexyldiamine, trans-1,4-diaminocyclohexane, 4,4'-diaminodicyclohexylmethane, 3,3'-dimethyl-4,4'-diaminodicyclohexylmethane, 3,3'-diethyl-4,4'-diaminodicyclohexylmethane, 3,3',5,5'-tetramethyl-4,4'-diaminodicyclohexylmethane, 3,3',5,5'-tetraethyl-4,4'-diaminodicyclohexylmethane, 3,5-diethyl-3',5'-dimethyl-4,4'-diaminodicyclohexylmethane, 4,4'-diaminodicyclohexyl ether, 3,3'-dimethyl-4,4'-diaminodicyclohexyl ether, 3,3'-diethyl-4,4'-diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-aminocyclohexyl)propane, 2,2-bis(3-methyl-4-aminocyclohexyl)propane, 2,2-bis(3-ethyl-4-aminocyclohexyl)propane, 2,2-bis(3,5-dimethyl-4-aminocyclohexyl)propane, 2,2-bis(3,5-diethyl-4-aminocyclohexyl)propane, 2,2-(3,5-diethyl-3',5'-dimethyl-4,4'-diaminodicyclohexyl)propane, and diamine compounds obtained by introducing an alkyl group, an alkoxy group, a halogen atom or the like into the alicyclic rings of the foregoing.

Examples of the aliphatic diamine compound include, but are not limited to, alkylene diamines such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, and 1,10-diaminodecane; ethylene glycol diamines such as bis(aminomethyl) ether, bis(2-aminoethyl) ether, and bis(3-aminopropyl) ether; and siloxane diamines such as 1,3-bis(3-aminopropyl) tetramethyldisiloxane, 1,3-bis(4-aminobutyl)tetramethyldisiloxane, and α,ω-bis(3-aminopropyl)polydimethylsiloxane.

These aromatic diamines, alicyclic diamines, or aliphatic diamines can be used either individually or in combination.

Since a polyimide resin of a substrate for a display to be used for a color filter or a touch screen is required to have thermal resistance, low water absorption, and high transparency in the visible region, the polyimide resin preferably has a trifluoromethyl group or an alicyclic monomer component as a bulky fluorine substituent in an acid dianhydride or a diamine component to impart transparency. That is, the polyimide resin preferably has at least one group selected from among a trifluoromethyl group and alicyclic hydrocarbon groups. In order to impart low water absorption, it is preferred that an acid dianhydride or a diamine component has a trifluoromethyl group. While a trifluoromethyl group-containing monomer and an alicyclic monomer component may be used either in both an acid dianhydride and a diamine component or in one of them, it is preferred from the viewpoint of easy availability of a monomer to use them in diamine components. In order to develop sufficient transparency or low water absorption, it is preferred that a diamine residue having at least one group selected from among a trifluoromethyl group and alicyclic hydrocarbon groups be contained in an amount of 50 mol % or more relative to the total amount of the diamine residues contained in the polyimide resin.

It is preferred to contain 4,4'-oxydiphthalic anhydride (ODPA), 3,3',4,4'-biphenyltetracarboxylic dianhydride (BPDA), 4,4'-(hexafluoroisopropylidene)diphthalic anhydride (6FDA), 2,2-bis(4-(3,4-dicarboxyphenoxy)phenyl) propane dianhydride (BSAA), 1,2,3,4-cyclobutanetetracarboxylic dianhydride (CBDA), or 1,2,4,5-cyclohexanetetracarboxylic dianhydride (PMDA-H) as the acid dianhydride in this case. It is preferred to contain 2,2-bis[3-(3-aminobenzamido)-4-hydroxyphenyl]hexafluoropropane (HFHA), trans-1,4-diaminocyclohexane (t-DACH), or 2,2'-bis(trifluoromethyl)benzidine (TFMB) as the diamine.

On the other hand, the polyimide resin of the substrate for a display to be used for an organic EL element is required to have thermal resistance and low water absorbing property. It is preferred to contain 3,3',4,4'-biphenyltetracarboxylic dianhydride (BPDA), 4,4'-oxydiphthalic anhydride (ODPA), 1,2,4,5-cyclohexanetetracarboxylic dianhydride (PMDA-H), 2,2-bis(4-(3,4-dicarboxyphenoxy)phenyl)propane dianhydride (BSAA), 4,4'-(hexafluoroisopropylidene)diphthalic anhydride (6FDA), or 1,2,3,4-cyclobutanetetracarboxylic dianhydride (CBDA) as the acid dianhydride in this case, and it is preferred to contain 4,4'-diaminodiphenyl ether, p-phenylenediamine, 3,3'-dimethylbenzidine, 2,2-bis[3-(3-aminobenzamido)-4-hydroxyphenyl]hexafluoropropane (HFHA), trans-1,4-diaminocyclohexane, or 2,2'-bis(trifluoromethyl)benzidine (TFMB) as the diamine. Since it is required to be transparent when light is taken out from the side of the substrate for a display, it is effective to introduce a trifluoromethyl group or an alicyclic monomer component into the acid dianhydride or the diamine component when light is taken out from the side of the substrate for a display. It is preferred to contain 4,4'-oxydiphthalic anhydride (ODPA), 3,3',4,4'-biphenyltetracarboxylic dianhydride (BPDA), 2,2-bis(4-(3,4-dicarboxyphenoxy)phenyl)propane dianhydride (BSAA), 4,4'-oxydiphthalic anhydride (ODPA), 4,4'-(hexafluoroisopropylidene)diphthalic anhydride (6FDA), 1,2,3,4-cyclobutanetetracarboxylic dianhydride (CBDA) as the acid dianhydride in this case. It is preferred to contain 2,2-bis[3-(3-aminobenzamido)-4-hydroxyphenyl] hexafluoropropane (HFHA), trans-1,4-diaminocyclohexane, or 2,2'-bis(trifluoromethyl)benzidine (TFMB) as the diamine.

Examples of a particularly preferable polyimide resin include a polyimide containing at least one of the repeating structural units represented by general formulae (1) to (3) as a main component.

[Chemical Formula 2]

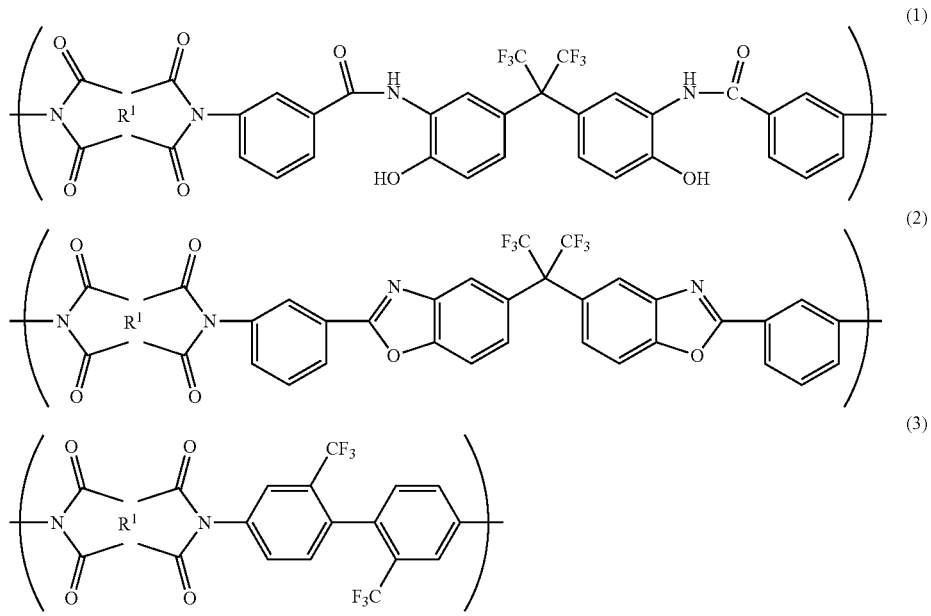

In general formulae (1) to (3), $R^1$ is at least one or more groups represented by (4) to (9).

[Chemical Formula 3]

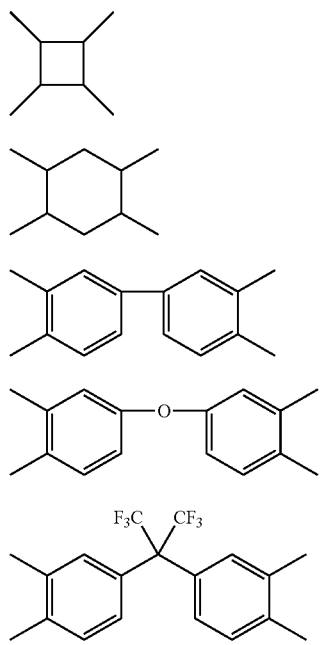

The term "main component" as used herein means to contain structural units represented by general formulae (1) to (3) in an amount of 50 mol % or more of all structural units of the polymer. Having structures represented by general formulae (1) to (3) in a diamine moiety of a polyimide can improve the low water absorption, transparency, and thermal resistance of a polyimide resin. Having aromatic or alicyclic acid anhydrides represented by general formulae (4) to (9) in an acid anhydride moiety makes it possible to obtain a polyimide resin high in thermal resistance and good in flexibility.

Examples of a particularly preferable polyimide resin include a polyimide resin containing at least one of the repeating structural units represented by general formula (10) as a main component.

[Chemical Formula 4]

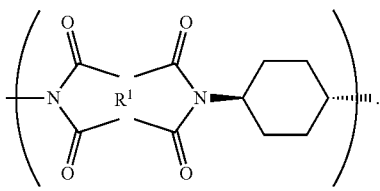

In general formula (10), $R^1$ is at least one or more groups represented by (4) to (9).

[Chemical Formula 5]

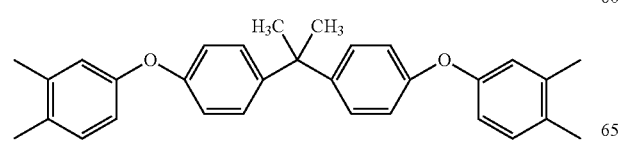

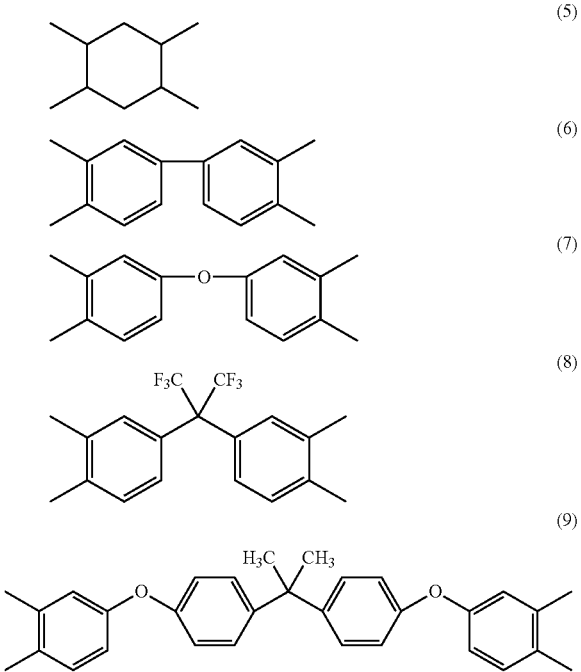

The term "main component" as used herein means to contain structural units represented by general formula (10) in an amount of 50 mol % or more of all structural units of the polymer.

Having a structure represented by general formula (10) in a diamine moiety of a polyimide can improve the transparency and thermal resistance of a polyimide resin. Having aromatic or alicyclic acid anhydrides represented by general formulae (4) to (9) in an acid anhydride moiety makes it possible to obtain a polyimide resin high in thermal resistance and good in flexibility.

Both terminals of the polyimide and the polyimide precursor resin may be blocked with an end cap compound in order to adjust a molecular weight in a preferable range. Examples of the end cap compound that reacts with an acid dianhydride include a monoamine and a monohydric alcohol. In addition, examples of the end cap compound that reacts with a diamine compound include an acid anhydride, a monocarboxylic acid, a monoacid chloride compound, a mono-active ester compound, a dicarbonic acid ester, and a vinyl ether. Moreover, various organic groups can be introduced as a terminal group by reacting an end cap compound.

Examples of the monoamine to be used as an end cap compound for a terminal of an acid anhydride group include, but are not limited to, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercapto naphthalene, 3-amino-4,6-dimercapto pyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-amino naphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, and 4,8-diethynyl-2-aminonaphthalene.

Examples of the monohydric alcohol to be used as the end cap compound for a terminal of an acid anhydride group include, but are not limited to, methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanol, 2-heptanol, 3-heptanol, 1-octanol, 2-octanol, 3-octanol, 1-nonanol, 2-nonanol, 1-decanol, 2-decanol, 1-undecanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nonadecanol, 2-nonadecanol, 1-eicosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanol, 6-methyl-2-heptanol, 2,4,4-trimethyl-1-hexanol, 2,6-dimethyl-4-heptanol, isononyl alcohol, 3,7-dimethyl-3-octanol, 2,4-dimethyl-1-heptanol, 2-heptylundecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether, cyclopentanol, cyclohexanol, cyclopentane monomethylol, dicyclopentane monomethylol, tricyclodecane monomethylol, norborneol, and terpineol.

Examples of the acid anhydride, monocarboxylic acid, monoacid chloride compound, and mono-active ester compound to be used as the end cap compound for a terminal of an amino group include acid anhydrides such as phthalic anhydride, maleic anhydride, nadic anhydride, cyclohexane dicarboxylic anhydride, and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxy naphthalene, 1-mercapto-4-carboxynaphthalene, 1-mercapto-3-carboxynaphthalene, 1-mercapto-2-carboxy naphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, and 8-ethynyl-2-naphthoic acid, and monoacid chloride compounds resulting from conversion of carboxyl groups of these acids into acid chlorides; monoacid chloride compounds resulting from conversion into acid chlorides of only monocarboxyl groups of dicarboxylic acids such as terephthalic acid, phthalic acid, maleic acid, cyclohexanedicarboxylic acid, 3-hydroxyphthalic acid, 5-norbornene-2,3-dicarboxylicacid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene; and active ester compounds resulting from a reaction of a monoacid chloride compound with N-hydroxybenzotriazole or N-hydroxy-5-norbornene-2,3-dicarboxyimide.

Examples of the dicarbonic ester compounds to be used as the end cap compound for a terminal of an amino group include di-tert-butyl dicarbonate, dibenzyl dicarbonate, dimethyl dicarbonate, and diethyl dicarbonate.

Examples of the vinyl ether compound to be used as the end cap compound for a terminal of an amino group include chloroformates, such as tert-butyl chloroformate, n-butyl chloroformate, isobutyl chloroformate, benzyl chloroformate, allyl chloroformate, ethyl chloroformate, and isopropyl chloroformate; isocyanate compounds, such as butyl isocyanate, 1-naphthyl isocyanate, octadecyl isocyanate, and phenyl isocyanate; butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether, and benzyl vinyl ether.

Examples of other compounds to be used as the end cap compound for a terminal of an amino group include benzyl chloroformate, benzoyl chloride, fluorenylmethyl chloroformate, 2,2,2-trichloroethyl chloroformate, allyl chloroformate, methanesulfonyl chloride, p-toluenesulfonyl chloride, and phenyl isocyanate.

The introduction ratio of the end cap compound for a terminal of an acid anhydride group is preferably within the range of 0.1 to 60 mol %, particularly preferably 0.5 to 50 mol % relative to the dianhydride component. The introduction ratio of the end cap compound for a terminal of an amino group is preferably within the range of 0.1 to 100 mol %, particularly preferably 0.5 to 70 mol % relative to the diamine component. It is permissible to introduce two or more different end groups by making two or more end cap compounds react.

The end cap compound that has been introduced into a polyimide precursor resin or a polyimide resin can be detected easily by the following method. For example, an end cap compound can be detected easily by dissolving a polymer into which the end cap compound has been introduced in an acidic solution to decompose the polymer into an amine component and an acid anhydride component which are structural units of the polymer, and then measuring them by gas chromatography (GC) or NMR. Alternatively, it can be detected easily also by directly measuring a polymer in which an end cap compound has been introduced, by pyrolytic gas chromatography (PGC), infrared spectrometry, $^1$H-NMR spectrometry, and $^{13}$C-NMR spectrometry.

<Thermally Cross-Linkable Compound>

The film A may contain a thermally cross-linkable compound. As the thermally cross-linkable compound, an epoxy compound and a compound having at least two alkoxymethyl groups or methylol groups are preferred. Owing to the possession of at least two of these groups, the compound undergoes a condensation reaction with the resin or the same type molecule and thus a crosslinked structure is formed and, as a result, the mechanical strength and the chemical resistance of a cured film after heat treatment can be improved.

Preferable examples of the epoxy compound include bisphenol A type epoxy resins, bisphenol F type epoxy resins, propylene glycol diglycidyl ether, polypropylene glycol diglycidyl ether, polymethyl (glycidyloxypropyl), and epoxy group-containing silicone, such as siloxane, but the present invention is not limited to them. Specific examples include EPICLON 850-S, EPICLON HP-4032, EPICLON HP-7200, EPICLON HP-820, EPICLON HP-4700, EPICLON EXA-4710, EPICLON HP-4770, EPICLON EXA-859CRP, EPICLON EXA-1514, EPICLON EXA-4880, EPICLON EXA-4850-150, EPICLON EXA-4850-1000, EPICLON EXA-4816, EPICLON EXA-4822 (trade names; produced by DIC Corporation), RIKARESIN BEO-60E, RIKARESIN BPO-20E, and RIKARESIN HBE-100, RIKARESIN DME-100 (trade names; produced by New Japan Chemical Co., Ltd.), EP-4003S, EP-4000S (trade names; produced by ADEKA Corporation), PG-100, CG-500, EG-200 (trade names; produced by Osaka Gas Chemicals Co., Ltd.), NC-3000, NC-6000 (trade names; produced by Nippon Kayaku Co., Ltd.), EPOX-MK R508, EPOX-MK R540, EPOX-MK R710, EPOX-MK R1710, VG3101L, VG3101M80 (trade names; produced by Printec Corporation), and Celloxide 2021P, Celloxide 2081, Celloxide 2083, Celloxide 2085 (trade names; produced by Daicel Corporation).

Examples of the compound having at least two alkoxymethyl groups or methylol groups include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (trade names; produced by Honshu Chemical Industry Co., Ltd.), NIKALAC (registered trademark) MX-290, NIKALAC MX-280, NIKALAC MX-270, NIKALAC MX-279, NIKALAC MW-100LM, and NIKALAC MX-750LM (trade names; produced by SANWA Chemical Co., Ltd.). Two or more of these may be contained.

Preferably, the thermally cross-linkable compound is contained in an amount of 0.01 to 50 parts by weight relative to 100 parts by weight of the resin.

<Coupling Agent>

In order to improve the adhesion with the substrate, a coupling agent, such as a silane coupling agent and a titanium coupling agent, can be added to the film A. Preferably, the coupling agent is contained in an amount of 0.1 to 10 parts by weight relative to 100 parts by weight of the resin.

<Inorganic Filler>

The film A may contain an inorganic filler. Examples of the inorganic filler include silica particulates, alumina particulates, titania particulates, and zirconia particulates. The shape of the inorganic filler is not particularly limited and examples thereof include a spherical shape, an elliptical shape, a flat shape, a rod shape, and a fibrous shape. In order to prevent scattering of light, the inorganic filler contained is preferably smaller in particle diameter. The average particle diameter is 0.5 to 100 nm and preferably is within the range of 0.5 to 30 nm. Preferably, the inorganic filler is contained in an amount of 1 to 100 parts by weight relative to 100 parts by weight of the resin. The addition of an inorganic filler having a particle diameter within the aforementioned range in an amount of 1 to 100 parts by weight relative to 100 parts by weight of the resin can reduce CTE or birefringence of the polyimide resin without impairing flexibility.

<Polysiloxane Resin>

The polysiloxane resin contained in the film B in the present invention is not particularly limited. When the polysiloxane resin composition to be used for the formation of the film B is nonphotosensitive or positive working photosensitive, one having a phenyl group or a naphthyl group is preferred from the viewpoint of the storage stability of a coating liquid, and one having an epoxy group or an amino group is preferred from the viewpoint of chemical resistance. When the polysiloxane resin composition to be used for the formation of the film B is negative working photosensitive, one having a phenyl group or a naphthyl group is preferred from the viewpoint of the storage stability of a coating liquid, one having a (meth)acryl group or a vinyl group is preferred from the viewpoint of curability, and one having a carboxyl group or a phenolic hydroxyl group is preferred from the viewpoint of pattern processability.

As the method for synthesizing the polysiloxane resin, a method of hydrolytic condensing an organosilane compound is common. Examples of the organosilane compound to be used for the synthesis of a polysiloxane include methyltrimethoxysilane, methyltriethoxysilane, ethyltrimethoxysilane, ethyltriethoxysilane, hexyltrimethoxysilane, octadecyltrimethoxysilane, octadecyltriethoxysilane, phenyltrimethoxysilane, phenyltriethoxysilane, diphenyldimethoxysilane, diphenyldiethoxysilane, 1-naphthyltrimethoxysilane, 2-naphthyltrimethoxysilane, 1-naphthyltriethoxysilane, 2-naphthyltriethoxysilane, 4-hydroxyphenyltrimethoxysilane, 4-hydroxyphenyltriethoxysilane, 4-hydroxybenzyltrimethoxysilane, 4-hydroxybenzyltriethoxysilane, 2-(4-hydroxyphenyl)ethyltrimethoxysilane, 2-(4-hydroxyphenyl)ethyltriethoxysilane, 3-aminopropyltriethoxysilane, N-(2-aminoethyl)-3-aminopropyltrimethoxysilane, 3-chloropropyltrimethoxysilane, 3-(N,N-diglycidyl)aminopropyltrimethoxysilane, 3-glycidoxypropyltrimethoxysilane, γ-aminopropyltrimethoxysilane, γ-aminopropyltriethoxysilane, N-β-(aminoethyl)-γ-aminopropyltrimethoxysilane, β-cyanoethyltriethoxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, α-glycidoxybutyltrimethoxysilane, α-glycidoxybutyltriethoxysilane, β-glycidoxybutyltrimethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, 2-(3,4-epoxycyclohexyl)ethyltripropoxysilane, 2-(3,4-epoxycyclohexyl)ethyltributoxysilane, 2-(3,4-epoxycyclohexyl)ethyltrimethoxysilane, 2-(3,4-epoxycyclohexyl)ethyltriethoxysilane, 2-(3,4-epoxycyclohexyl)ethyltriphenoxysilane, 3-(3,4-epoxycyclohexyl)propyltrimethoxysilane, 3-(3,4-epoxycyclohexyl)propyltriethoxysilane, 4-(3,4-epoxycyclohexyl)butyltrimethoxysilane, 4-(3,4-epoxycyclohexyl)butyltriethoxysilane, dimethyldimethoxysilane, dimethyldiethoxysilane, γ-glycidoxypropylmethyldimethoxysilane, γ-aminopropylmethyldimethoxysilane, γ-aminopropylmethyldiethoxysilane, N-(2-aminoethyl)-3-aminopropylmethyldimethoxysilane, glycidoxymethyldimethoxysilane, glycidoxymethylmethyldiethoxysilane, α-glycidoxyothylmethyldimethoxysilane, α-glycidoxyethylmethyldiethoxysilane, β-glycidoxyethylmethyldimethoxysilane, β-glycidoxyethylmethyldiethoxysilane, α-glycidoxypropylmethyldimethoxysilane, α-glycidoxypropylmethyldiethoxysilane, β-glycidoxypropylmethyldimethoxysilane, β-glycidoxypropylmethyldiethoxysilane, γ-glycidoxypropylmethyldimethoxysilane, γ-glycidoxypropylmethyldiethoxysilane, γ-glycidoxypropylethyldimethoxysilane, γ-glycidoxypropylethyldiethoxysilane, 3-chloropropylmethyldimethoxysilane, 3-chloropropylmethyldiethoxysilane, cyclohexylmethyldimethoxysilane, octadecylmethyldimethoxysilane, tetramethoxysilane, tetraethoxysilane, methyl silicate, trifluoromethyltrimethoxysilane, trifluoromethyltriethoxysilane, trifluoropropyltrimethoxysilane, trifluoropropyltriethoxysilane, 3-trimethoxysilylpropionic acid, 3-triethoxysilylpropionic acid, 3-dimethylmethoxysilylpropionic acid, 3-dimethylethoxysilylpropionic acid, 4-trimethoxysilylbutyric acid, 4-triethoxysilylbutyric acid, 4-dimethylmethoxysilylbutyric acid, 4-dimethylethoxysilylbutyric acid, 5-trimethoxysilylvaleric acid, 5-triethoxysilylvaleric acid, 5-dimethylmethoxysilylvaleric acid, 5-dimethylethoxysilylvaleric acid, 3-trimethoxysilylpropylsuccinic anhydride, 3-triethoxysilylpropylsuccinic anhydride, 3-dimethylmethoxysilylpropylsuccinic anhydride, 3-dimethylethoxysilylpropylsuccinic anhydride, 3-trimethoxysilylpropylcyclohexyldicarboxylic anhydride, 3-triethoxysilylpropylcyclohexyldicarboxylic anhydride, 3-dimethylmethoxysilylpropylcyclohexyldicarboxylic anhydride, 3-dimethylethoxysilylpropylcyclohexyldicarboxylic anhydride, 3-trimethoxysilylpropylphthalic anhydride, 3-triethoxysilylpropylphthalic anhydride, 3-dimethylmethoxysilylpropylphthalic anhydride, 3-dimethylethoxysilylpropylphthalic anhydride, vinyltrimethoxysilane, vinyltriethoxysilane, vinylmethyldimethoxysilane, vinylmethyldiethoxysilane, allyltrimethoxysilane, allyltriethoxysilane, allylmethyldimethoxysilane, allylmethyldiethoxysilane, styryltrimethoxysilane, styryltriethoxysilane, styrylmethyldimethoxysilane, styrylmethyldiethoxysilane, γ-acryloylpropyltrimethoxysilane, γ-acryloylpropyltriethoxysilane, γ-methacryloylpropyltrimethoxysilane, γ-methacryloylpropyltriethoxysilane, γ-methacryloylpropylmethyldimethoxysilane, γ-methacryloylpropylmethyldiethoxysilane, γ-acryloylpropylmethyldimethoxysilane, or γ-acryloylpropylmethyldiethoxysilane.

While the reaction conditions of the hydrolysis of the organosilane compound may be determined appropriately, for example, it is preferred to add an acid catalyst and water to the organosilane compound in a solvent over 1 to 180 minutes and then perform a reaction at room temperature to 110° C. for 1 to 180 minutes. By performing the hydrolysis reaction under such conditions, a rapid reaction can be suppressed. Preferably, the reaction temperature is 30° C. to 105° C. The hydrolysis reaction is preferably carried out in the presence of an acid catalyst. Preferred as the acid catalyst is an acidic aqueous solution containing formic acid, acetic acid, or phosphoric acid. Preferably, the content of such an acid catalyst is 0.1 to 5 parts by weight relative to 100 parts by weight of the whole organosilane compound to be used in the hydrolysis reaction. By adjusting the content of the acid catalyst within the above range, it is possible to easily control the hydrolysis reaction to advance necessarily and sufficiently. As to the condition of the condensation reaction, it is preferred that after obtaining a silanol compound by the hydrolysis reaction of the organosilane compound, the reaction solution be heated as it is at a temperature of from 50° C. to the boiling point of the solvent for 1 to 100 hours. In order to increase the degree of polymerization of the polysiloxane, reheating may be conducted or a basic catalyst may be added. According to necessity, an appropriate amount of alcohol produced or the like may be distilled and removed by heating and/or reducing pressure after the hydrolysis reaction and thereafter a solvent may optionally be added.

Preferably, the weight average molecular weight (Mw) of the polysiloxane resin contained in the MM. B is 1000 to 100000 as measured by GPC in terms of polystyrene. By adjusting Mw into the above range, the coating characteristic and the solubility in a developing solution at the time of pattern formation are made satisfactory.

<Inorganic Oxide Particles>

The film B containing the polysiloxane resin contains inorganic oxide particles. Containing the inorganic oxide particles makes it possible to reduce the CTE of the film B, and forming the film B on at least one surface of the film A makes it possible to reduce the CTE of the resin stack.

The number average particle diameter of the inorganic oxide particles is preferably 1 to 200 nm, and in order to obtain a cured film high in transmittance, it is preferably 1 to 70 nm. The number average particle diameter of inorganic oxide particles can be calculated in the following procedure. A surface of the film B is observed using a SEM (scanning electron microscope) at 10000 magnifications, and the image of particles is connected to an image analyzer (for example, QTM900 produced by Cambridge Instruments). Data are captured while varying the observation site, and when the total number of particles has reached 5000 or more, numerical processing described below is performed and the number average diameter d determined thereby is taken as an average particle size (diameter).

$$d = \Sigma di/N$$

Herein, di is an equivalent circular diameter of a particle (a diameter of a circle having an area equal to the cross sectional area of the particle), and N is the number of particles.

While the inorganic oxide may be of various types and is not particularly limited in type, silicon oxide (silica), hollow silica, aluminum oxide (alumina), titanium oxide, antimony oxide, zinc oxide, tin oxide, zirconium oxide, etc. are used preferably. Especially, silicon dioxide is preferable from the viewpoints of transparency attained when dispersed in a polysiloxane resin, reduction in CTE, price, and availability.

One of or two or more of these inorganic oxides are selected appropriately and used. While the form of the inorganic oxide to be added is not particularly limited, such forms as powder and sol are preferable.

The inorganic oxide particles can be prepared by obtaining appropriate nanoparticle powders and grinding or dispersing them using a disperser such as a bead mill. Examples of commercially available nanoparticle powders include REA200, RA200SH, RA200H (silica; manufactured by Nippon Aerosil Co., Ltd.), T-BTO-020RF (barium titanate; manufactured by Toda Kogyo Corp.), UEP-100 (zirconium oxide; manufactured by Daiichi Kigenso Kagaku Kogyo Co., Ltd.) and STR-100N (titanium oxide; manufactured by Sakai Chemical Industry Co., Ltd.). These can also be obtained in the form of a dispersion. Examples of the silica particle include IPA-ST and MIBK-ST, having a number average particle diameter of 12 nm, IPA-ST-L having a number average particle diameter of 45 nm, IPA-ST-ZL having a number average particle diameter of 100 nm, PGM-ST having a number average particle diameter of 15 nm (trade names, manufactured by Nissan Chemical Industries, Ltd.), "OSCAL (registered trademark)" 101 having a number average particle diameter of 12 nm, "OSCAL" 105 having a number average particle diameter of 60 nm, "OSCAL" 106 having a number average particle diameter of 120 nm, "CATALOID (registered trademark)"-S having a number average particle diameter of 5 to 80 nm (trade names, manufactured by Catalysts & Chemicals Ind. Co., Ltd.), "Quartron (registered trademark)" PL-2L-PGME having a number average particle diameter of 16 nm, "Quartron" PL-2L-BL and "Quartron" PL-2L-DAA, having a number average particle diameter of 17 nm, "Quartron" PL-2L and GP-2L, having a number average particle diameter of 18 to 20 nm (trade names, manufactured by FUSO CHEMICAL Co., Ltd.), Silica ($SiO_2$) SG-SO 100 having a number average particle diameter of 100 nm (trade name, manufactured by KCM Corporation), and "REOLOSIL (registered trademark)" having a number average particle diameter of 5 to 50 nm (trade name, manufactured by Tokuyama Corporation). In addition, "Thrulya" 4110, which is a hollow silica particle having a number average particle diameter of 60 nm, is also enumerated. Examples of silicon oxide-titanium oxide particles include "OPTOLAKE" (registered trademark) TR-502, "OPTOLAKE" TR-503, "OPTOLAKE" TR-504, "OPTOLAKE" TR-513, "OPTOLAKE" TR-520, "OPTOLAKE" TR-527, "OPTOLAKE" TR-528, "OPTOLAKE" TR-529, "OPTOLAKE" TR-544 and "OPTOLAKE" TR-550 (all manufactured by JGC Catalysts and Chemicals Ltd.). Examples of the zirconium oxide include BIRAL Zr-C20 (average particle diameter=20 nm; manufactured by Taki Chemical Co., Ltd.), ZSL-10A (average particle diameter=from 60 to 100 nm; manufactured by Daiichi Kigenso Kagaku Kogyo Co., Ltd.), NanoUse OZ-30M (average particle diameter=7 nm; manufactured by Nissan Chemical Industries, Ltd.), SZR-M and SZR-K (both manufactured by Sakai Chemical Industry Co., Ltd.) and HXU-120JC (manufactured by Sumitomo Osaka Cement Co., Ltd.).

The content of the inorganic oxide particles is not particularly limited, but it is preferably within the range of 20 to 80% by weight in the film B. From the viewpoint of crack resistance, it is more preferably 20 to 65% by weight. If the content is within this range, generation of cracks in the film B can be further suppressed and the CTE of a stack is further reduced.

<Polysiloxane Resin Composition to be used for Formation of Film B>

Preferably, the solid concentration of the polysiloxane resin composition to be used for the formation of the film B is 5 to 35 wt % because it is easy to control the film thickness.

The polysiloxane resin composition also may contain a photosensitizing agent. Photosensitizing a polysiloxane resin composition makes it possible to obtain a patterned resin stack composed of films A and B at once via one set of exposure and development. More specifically, patterned films A and B can be obtained by coating a photosensitive polysiloxane resin composition for forming a film B' onto a film A' (a film containing a polyimide precursor resin), followed by exposure to light, development, and curing. When the photosensitive resin composition is of a positive working type, a quinone diazide compound is preferable as a component to impart photosensitivity. A mixture of a quinone diazide compound and an alkali-soluble resin forms a positive working type via exposure to light and alkali development. Preferred as the quinone diazide compound is a compound in which naphthoquinonediazide sulfonic acid is ester-linked to a compound having a phenolic hydroxyl group, and a compound having hydrogen or a substituent represented by the following formula (13) independently at the ortho-position and the para-position with respect to the phenolic hydroxyl group of that compound is used.

[Chemical Formula 6]

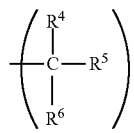

(13)

$R^4$ through $R^6$ may be either the same or different from each other and represent an alkyl group having 1 to 10 carbon atoms, a carboxyl group, a phenyl group, or a substituted phenyl group, or $R^4$ and $R^5$, $R^4$ and $R^6$, or $R^5$ and $R^6$ may form a ring.

In the substituents represented by general formula (13), $R^4$ through $R^6$ may be either the same or different from each other and each represent a substituted or non-substituted alkyl group having 1 to 10 carbon atoms, a carboxyl group, a phenyl group, or a substituted phenyl group. The alkyl group may be a methyl group, an ethyl group, a n-propyl group, an isopropyl group, a n-butyl group, an isobutyl group, a t-butyl group, a n-hexyl group, a cyclohexyl group, a n-heptyl group, a n-octyl group, a trifluoromethyl group, or a 2-carboxyethyl group, for example. The substituent to substitute for the hydrogen of a phenyl group may be a hydroxyl group. Examples of the ring to be formed by $R^4$ and $R^5$, $R^4$ and $R^6$, or $R^5$ and $R^6$ include a cyclopentane ring, a cyclohexane ring, an adamantane ring, or a fluorene ring.

When the ortho position and the para position with respect to a phenolic hydroxyl group are other than hydrogen or a substituent represented by general formula (13), oxidative dissolution is caused by thermal curing and thus a conjugated compound typified by a quinoid structure is formed and the cured film is colored and, as a result, the colorless transparency is deteriorated. The quinone diazide compound can be synthesized via a known esterification reaction of a compound having a phenolic hydroxyl group and naphthoquinonediazidesulfonyl chloride.

Examples of the compound having a phenolic hydroxyl group include the following compounds (produced by Honshu Chemical Industry Co., Ltd.).

[Chemical Formula 7]

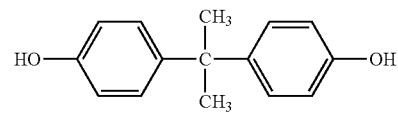

Bisphenol A

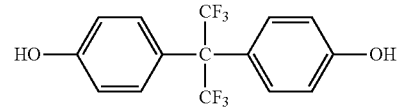

BisP-AF

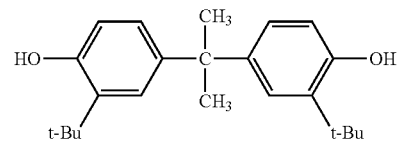

BisOTBP-A

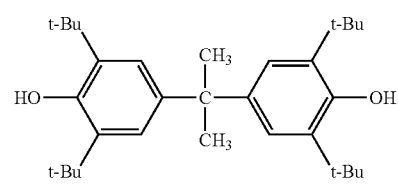

Bis26B-A

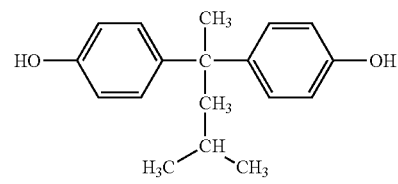

BisP-MIBK

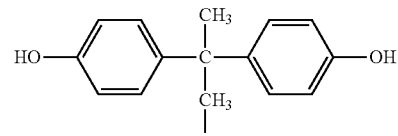

BisP-B

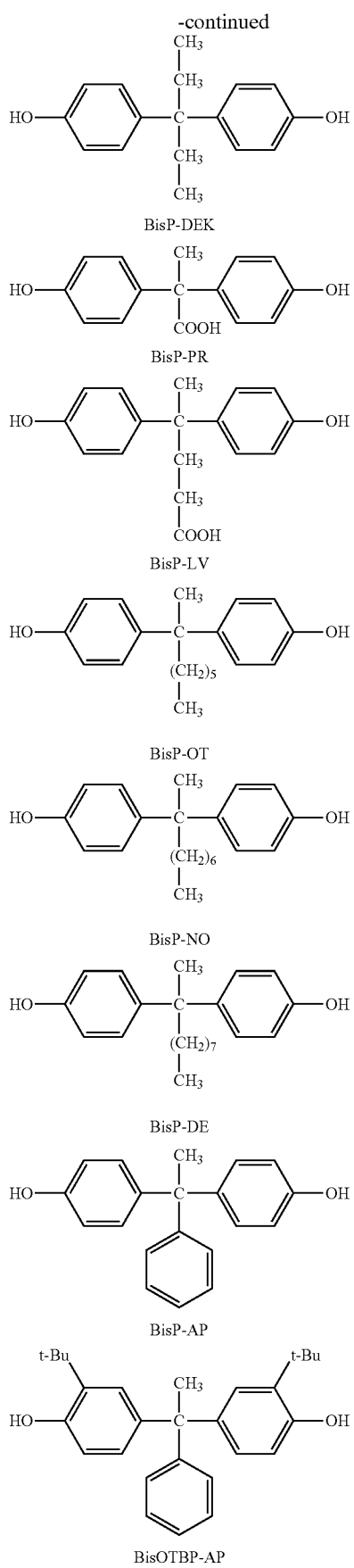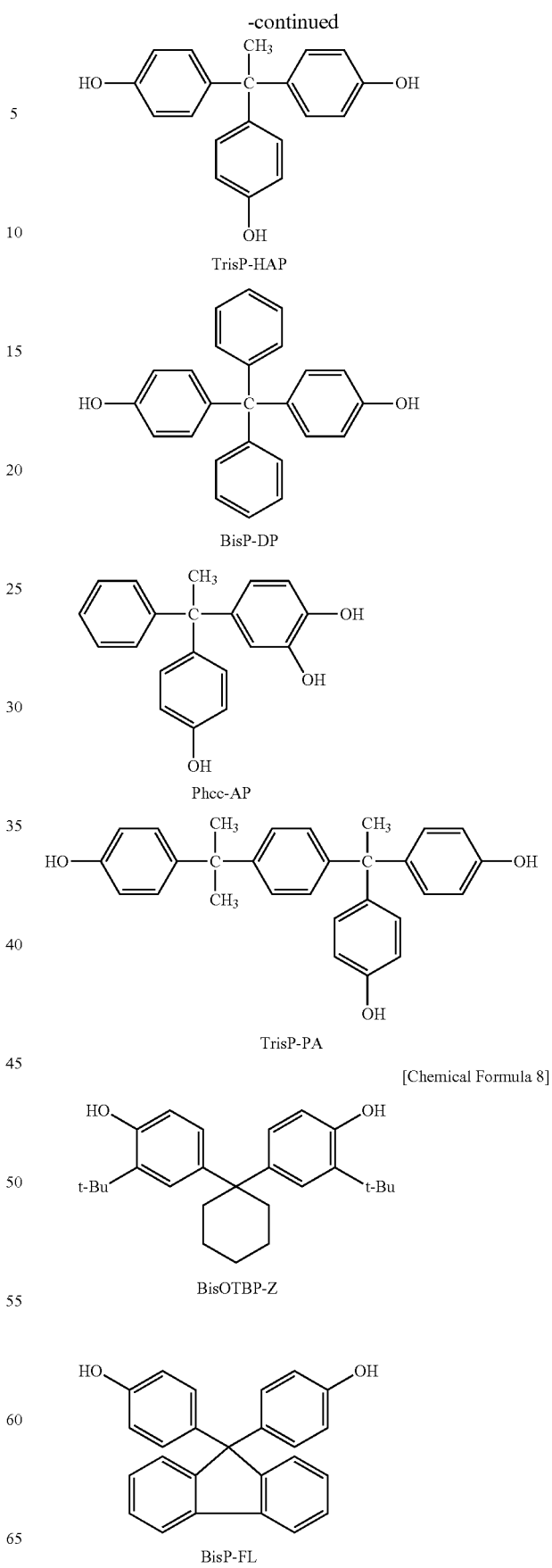

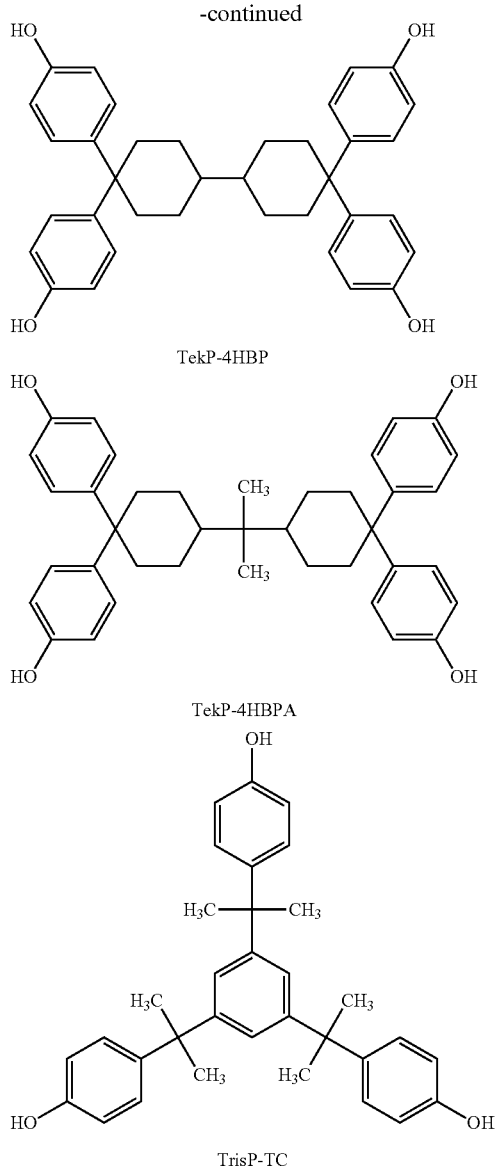

TekP-4HBP

TekP-4HBPA

TrisP-TC

Examples of the naphthoquinonediazidesulfonic acid include 4-naphthoquinonediazidesulfonic acid or 5-naphthoquinonediazidesulfonic acid. A 4-naphthoquinonediazidesulfonic acid ester compound is suitable for i-line exposure because it has absorption in the range of i-line (wavelength: 365 nm). A 5-naphthoquinonediazidesulfonic acid ester compound is suitable for exposure to light at a wavelength in a wide range because it has absorption in a wide wavelength range. Preferably, a 4-naphthoquinonediazidesulfonic acid ester compound or a 5-naphthoquinonediazidesulfonic acid ester compound is selected appropriately according to the wavelength of light for exposure. The 4-naphthoquinonediazidesulfonic acid ester compound and the 5-naphthoquinonediazidesulfonic acid ester compound may be mixed in use.

The molecular weight of the naphthoquinonediazide is preferably 300 to 1500, more preferably 350 to 1200. If the molecular weight of the naphthoquinonediazide compound is larger than 1500, it may be impossible to form a pattern at an addition amount of 4 to 10% by weight. On the other hand, if the molecular weight of the naphthoquinonediazide compound is smaller than 300, the colorless transparency may deteriorate.

When the photosensitive polysiloxane composition is of a negative working type, a photopolymerization initiator and a polyfunctional monomer are preferred as components to impart photosensitivity.

The photopolymerization initiator which is a component to impart photosensitivity is preferably one that decomposes and/or reacts upon exposure to light (including ultraviolet rays and electron beams) to generate radicals. Examples of the photopolymerization initiator that decomposes and/or reacts upon exposure to light to generate radicals include 2-methyl-[4-(methylthio)phenyl]-2-morpholinopropan-1-one, 2-dimethylamino-2-(4-methylbenzyl)-1-(4-morpholin-4-yl-phenyl)-butan-1-one, 2-benzyl-2-dimethylamino-1-(4-morpholinophenyl)-butanone-1,2,4,6-trimethylbenzoyl phenylphosphine oxide, bis(2,4,6-trimethylbenzoyl)-phenylphosphine oxide, bis(2,6-dimethoxybenzoyl)-(2,4,4-trimethylpentyl)-phosphine oxide, 1-phenyl-1,2-propanedione-2-(o-ethoxycarbonyl)oxime, 1,2-octanedione, 1-[4-(phenylthio)-2-(O-benzoyloxime)], 1-phenyl-1,2-butadione-2-(o-methoxycarbonyl)oxime, 1,3-diphenylpropanetrione-2-(o-ethoxycarbonyl)oxime, ethanone, 1-[9-ethyl-6-(2-methylbenzoyl)-9H-carbazol-3-yl]-, 1-(O-acetyloxime), 4,4-bis(dimethylamino)benzophenone, 4,4-bis(diethylamino)benzophenone, ethyl p-dimethylaminobenzoate, 2-ethylhexyl-p-dimethylaminobenzoate, ethyl p-diethylaminobenzoate, diethoxyacetophenone, 2-hydroxy-2-methyl-1-phenylpropan-1-one, benzyldimethylketal, 1-(4-isopropylphenyl)-2-hydroxy-2-methylpropan-1-one, 4-(2-hydroxyethoxy)phenyl-(2-hydroxy-2-propyl) ketone, 1-hydroxycyclohexyl-phenyl ketone, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenyl sulfide, alkylated benzophenone, 3,3',4,4'-tetra(t-butylperoxycarbonyl)benzophenone, 4-benzoyl-N,N-dimethyl-N-[2-(1-oxo-2-propenyloxy)ethyl] benzenemethanaminium bromide, (4-benzoylbenzyl) trimethylammonium chloride, 2-hydroxy-3-(4-benzoylphenoxy)-N,N,N-trimethyl-1-propenaminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propanaminium chloride, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphorquinone, methylphenyl glyoxyester, η5-cyclopentadienyl-η6-cumenyl-iron(1+)-hexafluorophosphate (1−), diphenyl sulfide derivatives, bis(η5-2,4-cyclopentadien-1-yl)-bis(2,6-difluoro-3-(1H-pyrrol-1-yl)-phenyl)titanium, thioxanthone, 2-methylthioxanthone, 2-chlorothioxanthone, 4-benzoyl-4-methyl phenyl ketone, dibenzyl ketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzyl methoxyethyl acetal, anthraquinone, 2-t-butylanthraquinone, 2-aminoanthraquinone, β-chloranthraquinone, anthrone, benzanthrone, dibenzosuberone, methyleneanthrone, 4-azidobenzalacetophenone, 2,6-bis(p-azidobenzylidene)cyclohexane, 2,6-bis(p-azidobenzylidene)-4-methylcyclohexanone, naphthalenesulfonyl chloride, quinolinesulfonyl chloride, N-phenylthioacridone, benzothiazole disulfide, triphenylphosphine, carbon tetrabromide, tribromophenylsulfone, benzoyl peroxide, and a combination of a photoreducible dye such as eosin or methylene blue and a reducing agent such as ascorbic acid or triethanolamine. Two or more of these may be contained. In order to enhance the hardness of a cured film, α-aminoalkylphenone compounds, acylphosphine oxide compounds, oxime ester compounds, benzophenone compounds having an amino group, and benzoic ester compounds having an amino group are preferred.

Examples of the α-aminoalkylphenone compounds include 2-methyl-[4-(methylthio)phenyl]-2-morpholinopropan-1-one, 2-dimethylamino-2-(4-methylbenzyl)-1-(4-morpholin-4-yl-phenyl)-butan-1-one, and 2-benzyl-2-dimethylamino-1-(4-morpholinophenyl)-butanone-1. Examples of the acylphosphine oxide compounds include 2,4,6-trimethylbenzoyl phenylphosphine oxide, bis(2,4,6-trimethylbenzoyl)-phenylphosphine oxide, and bis(2,6-dimethoxybenzoyl)-(2,4,4-trimethylpentyl)-phosphine oxide. Examples of the oxime ester compounds include 1-phenyl-1,2-propanedione-2-(o-ethoxycarbonyl)oxime, 1,2-octanedione, 1-[4-(phenylthio)-2-(O-benzoyloxime)], 1-phenyl-1,2-butadione-2-(o-methoxycarbonyl)oxime, 1,3-diphenylpropanetrione-2-(o-ethoxycarbonyl)oxime, and ethanone, 1-[9-ethyl-6-(2-methylbenzoyl)-9H-carbazol-3-yl]-, 1-(O-acetyloxime). Examples of the benzophenone compounds having an amino group include 4,4-bis(dimethylamino)benzophenone and 4,4-bis(diethylamino)benzophenone. Examples of the benzoic ester compounds having an amino group include ethyl p-dimethylaminobenzoate, 2-ethylhexyl p-dimethylaminobenzoate, and ethyl p-diethylaminobenzoate.

Examples of the polyfunctional monomer, which is a component to impart photosensitivity, include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dientaerythritol pentaacrylate, dipentaerythritol hexaacrylate, tripentaerythritol heptaacrylate, tripentaerythritol octaacrylate tetrapentaerythritol nonaacrylate, tetrapentaerythritol decaacrylate, pentapentaerythritol undecaacrylate, pentapentaerythritol dodecaacrylate, tripentaerythritol heptamethacrylate, tripentaerythritol octamethacrylate, tetrapentaerythritol nonamethacrylate, tetrapentaerythritol decamethacrylate, pentapentaerythritol undecamethacrylate, pentapentaerythritol dodecamethacrylate, dimethylol-tricyclodecane diacrylate, ethoxylated bisphenol A diacrylate, 9,9-bis[4-(2-acryloyloxyethoxy)phenyl]fluorene, 9,9-bis[4-(2-methacryloyloxyethoxy)phenyl]fluorene, 9,9-bis[4-(2-methacryloyloxyethoxy)-3-methylphenyl]fluorene, (2-acryloyloxypropoxy)-3-methylphenyl]fluorene, 9,9-bis[4-(2-acryloyloxyethoxy)-3,5-dimethylphenyl]fluorene, and 9,9-bis[4-(2-methacryloyloxyethoxy)-3,5-dimethylphenyl]fluorene; from the viewpoint of improving sensitivity, pentaerythritol tetraacrylate, dipentaerythritol pentaacrylate, dipentaerythritol hexaacrylate, tripentaerythritol heptaacrylate, or tripentaerythritol octaacrylate is preferred, and from the viewpoint of improving hydrophobicity, dimethylol-tricyclodecane diacrylate, dimethylol-tricyclodecane dimethacrylate, ethoxylated bisphenol A diacrylate, or 9,9-bis[4-(2-acryloyloxyethoxy)phenyl]fluorene is preferred.

Examples of other polyfunctional monomers include epoxy(meth)acrylates obtained by reacting polyfunctional epoxy compounds with (meth)acrylic acid. Examples of such polyfunctional epoxy compounds include the following compounds.

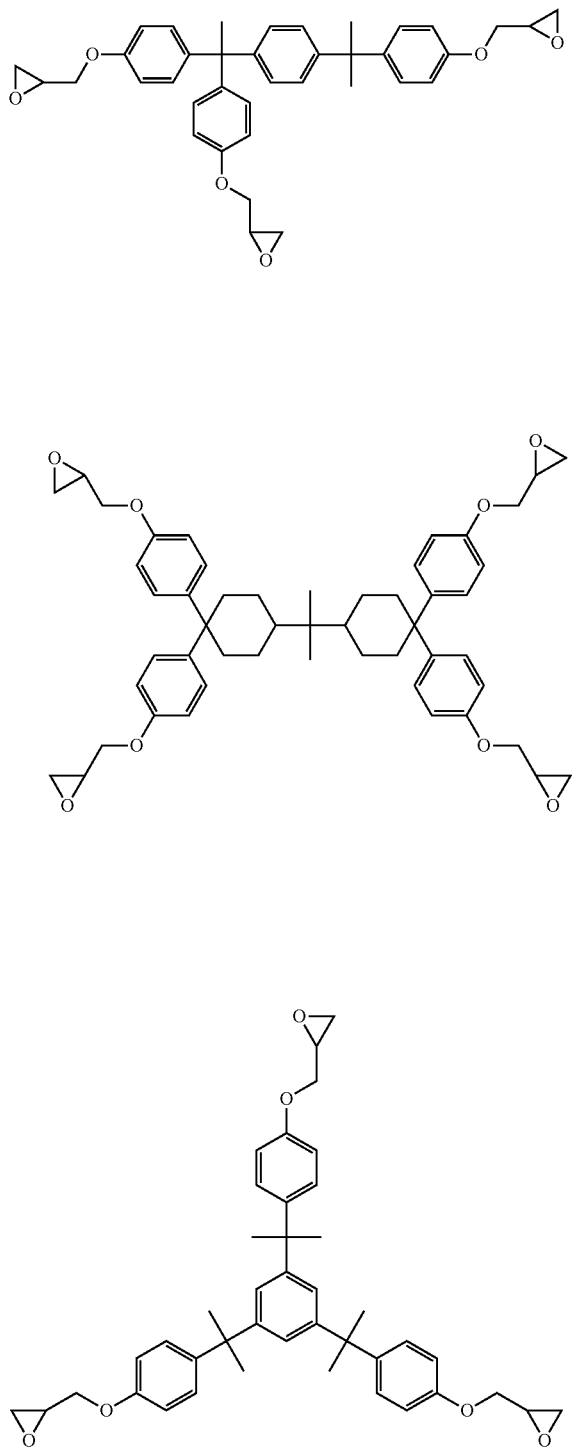

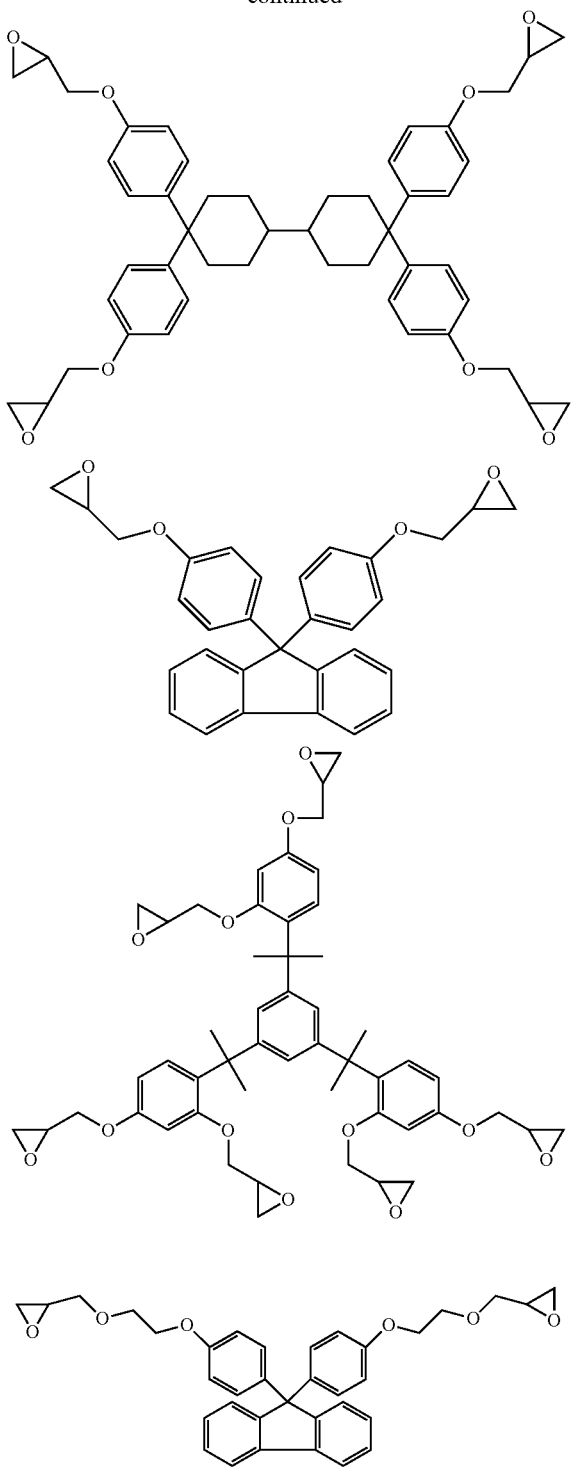

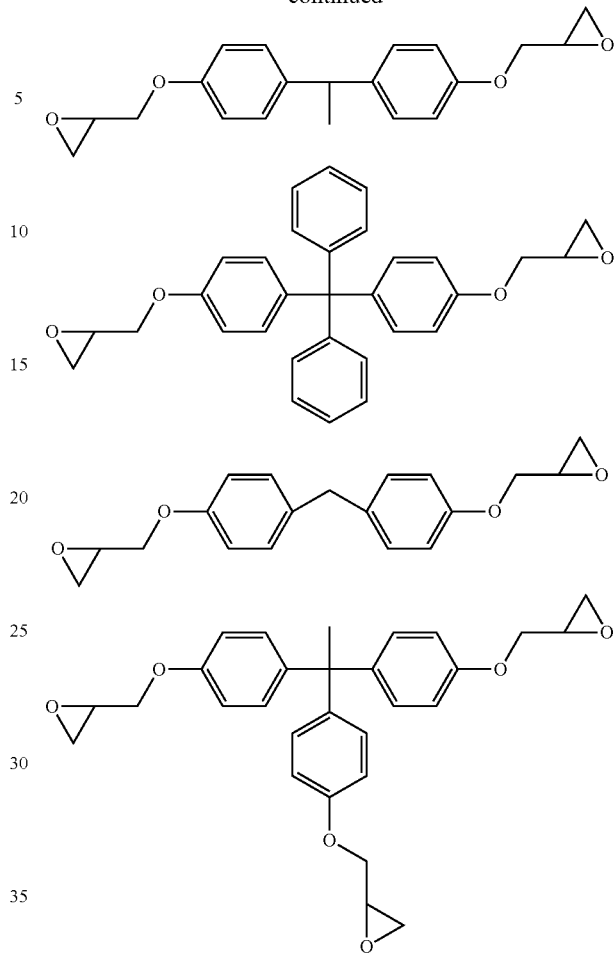

[Chemical Formula 10]

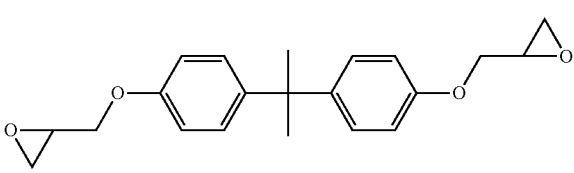

Preferably, the temperature of 3% weight loss (Td3) of the film B to be used in the present invention is 300° C. or more. Owing to this, degassing is suppressed, for example, when a gas barrier film is formed on the resin stack of the present invention, generation of cracks in the gas barrier film due to degassing is suppressed and, as a result, the display performance of a display is improved. The temperature of 3% weight loss (Td3) as referred to herein means a temperature attained when the weight has decreased by 3% relative to the weight measured when the plenary measurement is conducted at a temperature raising rate of 10° C./min in the third step that follows raising the temperature to 150° C. at a temperature raising rate of 3.5° C./min in the first step to remove the absorbed water of the sample, and cooling to 40° C. at a temperature lowering rate of 10° C./min in the second step, followed by measuring the weight attained when cooling to 40° C.

<Transmitted Chromaticity Coordinates of Film B>

Preferably, the transmitted chromaticity coordinates of the film B are within the ranges of 0.300≤x≤0.325 and 0.305≤y≤0.325. Owing to this, the transmitted light recognized visually through the resin stack can be made to have a color tone near white. More preferably, the transmitted chromaticity coordinates are within the ranges of 0.300≤x≤0.310 and 0.305≤y≤0.315. The "transmitted chromaticity coordinates" as referred to herein means coordinates of transmitted chromaticity in the CIE1931 color system measured in a 2 degree viewing field using a C light source.

<Coloring Agent>

The resin layer of the film B preferably contains a coloring agent in order to bring its transmitted chromaticity coordinates into the above ranges. While examples of the coloring agent include an organic pigment, an inorganic pigment, or a dye, a blue pigment, a blue dye, a violet pigment, or a violet dye is preferred for the purpose of color tone adjustment of transmitted light.

While examples of the blue pigment include C. I. Pigment Blue 1, 1:2, 9, 14, 15, 15:1, 15:2, 15:3, 15:4, 15:6, 16, 17, 19, 25, 27, 28, 29, 33, 35, 36, 56, 56:1, 60, 61, 61:1, 62, 63, 66, 67, 68, 71, 72, 73, 74, 75, 76, 78, or 79, C. I. Pigment Blue 15, 15:1, 15:2, 15:3, 15:4, 15:6 or 60 is preferred, and C.I. Pigment Blue 15:6 is more preferred.

While examples of the violet pigment include C.I. Pigment Violet 1, 1:1, 2, 2:2, 3, 3:1, 3:3, 5, 5:1, 14, 15, 16, 19, 23, 25, 27, 29, 31, 32, 37, 39, 42, 44, 47, 49 or 50, C. I. Pigment Violet 19 or 23 is preferred, and C.I. Pigment Violet 23 is more preferred.

Such pigments may, according to necessity, have been subjected to surface treatment such as rosin treatment, acidic group treatment, basic treatment, or the like, and a pigment derivative may have been added thereto as a dispersing agent.

The form of a dye may be any dye form such as an oil-soluble dye, an acid dye, a direct dye, a basic dye, a mordant dye, or an acid mordant dye. The dye may be laked in use or the dye may be in the form of a salt-forming compound of the dye with a nitrogen-containing compound, etc.

The dye is not particularly limited as long as it is one commonly called dye; especially, triphenylmethane dyes, diphenylmethane dyes, quinoline dyes, thiazine dyes, thiazole dyes, xanthene dyes, flavin dyes, auramine dyes, safranine dyes, phloxine dyes, methylene blue dyes, rhodamine dyes, etc. can preferably be used. Specific examples include C. I. Solvent Blue 2, 3, 4, 5, 7, 18, 25, 26, 35, 36, 37, 38, 43, 44, 45, 48, 51, 58, 59, 59:1, 63, 64, 67, 68, 69, 70, 78, 79, 83, 94, 97, 98, 100, 101, 102, 104, 105, 111, 112, 122, 124, 128, 129, 132, 136, 137, 138, 139, 143, C. I. Acid Blue 22, 25, 40, 78, 92, 113, 129, 167, 230, C. I. Basic Blue 3, 7, 9, 17, 41, 66, C. I. Solvent Violet 2, 8, 9, 11, 13, 14, 21, 21:1, 26, 31, 36, 37, 38, 45, 46, 47, 48, 49, 50, 51, 55, 56, 57, 58, 59, 60, 61, and C. I. Acid Red 52, 87, 91, 92, 94, 289.

In the case of a basic dye form, it is preferably a salt forming compound which forms a salt using an organic acid or perchloric acid. Preferably, the organic acid is an organic sulfonic acid or an organic carboxylic acid. Especially, a naphthalenesulfonic acid such as tobias acid or perchloric acid is preferred from the viewpoint of tolerance.

In the case of an acid dye or direct dye form, from the viewpoint of tolerance, it is preferably a salt forming compound which forms a salt using a quaternary ammonium salt compound, a tertiary amine compound, a secondary amine compound, a primary amine compound, or a resin component having such a functional group, or preferably a salt forming compound being a sulfonic acid amide compound by sulfonamidation.

While such coloring agents may be used individually, it is preferred to use two or more of them in combination because it becomes easy to make transmitted light closer to a white color. The combination of coloring agents is preferably a combination of coloring agents selected from the group consisting of C. I. Pigment Blue 15:6, C. I. Pigment Violet 23, and C. I. Acid Red 289.

The film B may contain, in addition to a blue pigment, a blue dye, a violet pigment, or a violet dye, another pigment or dye in order to adjust the transmitted color tone more exactly. Such another pigment may be a red pigment, a green pigment, or an orange pigment.

The proportion accounted for by the coloring agent in the film B is preferably 0.0001 to 10% by weight, more preferably 0.001 to 1% by weight, relative to the solid component because it becomes easy to adjust color tone.

Preferably, the film B contains a pigment derivative or a polymer dispersing agent as a dispersing agent.

<Production of Resin Stack>

While the method for producing the resin stack of the present invention is not particularly limited, it preferably contains the following steps:

(1) a step of coating a resin solution containing a polyimide precursor resin onto a substrate to obtain a film A';
(2) a step of coating a polysiloxane resin composition onto the film A' to obtain a film B'; and
(3) a step of heating the film A' and the film B' individually to obtain a resin stack.

The respective steps will be described. First, the substrate in the step (1) is not particularly limited, and alkali-free glass, a silicon wafer, ceramics, gallium arsenide, soda lime glass, etc. can be used.

Examples of the coating method include a slit coating method, a spin coating method, a spray coating method, a roll coating method, and a bar coating method; the coating may be performed by using these methods in combination.

Next, the solvent in the resin varnish is removed by drying. The drying is performed by using a hot plate, an oven, infrared rays, a vacuum chamber, or the like. In the use of a hot plate, an object to be heated is heated while being held on the plate directly or on a jig such as a proximity pin disposed on the plate. Examples of the material of the proximity pin include metallic materials such as aluminum and stainless steel and synthetic resins such as polyimide resin and "TEFLON" (registered trademark), and proximity pins made of any material may be used. The height of the proximity pin varies depending upon the size of the substrate, the type of the resin layer as the object to be heated, the purpose of heating, and so on; for example, when a resin layer coated on a glass substrate measuring 300 mm×350 mm×0.7 mm is to be heated, the height of the proximity pin is preferably from about 2 mm to about 12 mm.

Especially, it is preferred to vacuum dry using a vacuum chamber, and it is more preferred to further perform heating for drying after the vacuum drying or to perform heating for drying simultaneously with the vacuum drying. This enables reduction of the drying process time and, moreover, a uniform coating film can be obtained. While the heating temperature for drying varies depending upon the type of the object to be heated and the purpose of heating, the heating is preferably performed at a temperature within the range of from room temperature to 170° C. for a time ranging from one minute to several hours. While room temperature is usually 20 to 30° C., it is preferably 25° C. Moreover, the drying step may be performed twice or more times under the same condition or different conditions. Thus, a film A' is formed.

Subsequently, a polysiloxane resin composition is coated onto the film A' in the step (2) in the same procedure as that used for forming the film A', followed by a drying step. Thus, a film B' can be formed on the film A'.

Next, in the step (3), the resin coating film is heated within the range of 180° C. or more to 500° C. or less to obtain a resin stack composed of a film A and a film B. The heating step may be performed via any step after the drying step.

The atmosphere of the heating step is not particularly limited, and either air or an inert gas, such as nitrogen and argon, is available. It is noted that if heating is performed under an atmosphere high in oxygen concentration, mechanical characteristics deteriorate, for example, the film A and the film B become brittle due to oxidative degradation. In order to suppress such deterioration of mechanical characteristics, it is preferred to perform thermal curing by heating under an atmosphere having an oxygen concentration of 5% or less. On the other hand, it is often difficult to control oxygen concentration on the order of ppm at a manufacturing site. Preferably, the oxygen concentration at the time of heating is 5% or less because the resin film of the present invention can maintain higher mechanical characteristics.

When the resin composition to be used for the formation of the film B' is a photosensitive resin composition and patterning is performed after the formation of the coating film B', a step of subjecting the film B' to exposure to light and development may be added after the step of obtaining the film B'. Light of 10 J/m$^2$ to 1000 J/m$^2$ (in terms of exposure dose at a wavelength of 365 nm) is applied through or not through a desired mask using an exposer such as a stepper, a mirror projection mask aligner (MPA), or a parallel light mask aligner (PLA). The light source is not particularly limited, and ultraviolet rays such as i-line, g-line, or h-line, KrF (wavelength: 248 nm) laser or ArF (wavelength: 193 nm) laser, or the like can be used.

Next, a pattern can be formed by dissolving unexposed portions or exposed portions by development. A preferred development method is immersion in a developing solution for 5 seconds to 10 minutes by means of, for example, showering, dipping, or puddling.

A known alkali developing solution can be used as a developing solution. Specific examples thereof include aqueous solutions containing one or more of inorganic alkalis such as hydroxides, carbonates, phosphates, silicates, and borates of alkali metals; amines such as 2-dimethylaminoethanol, monoethanolamine, and diethanolamine; and quaternary ammonium salts such as tetramethylammonium hydroxide and choline. After the development, the film is preferably rinsed with water, and then may be dry-baked at a temperature in the range of 50° C. to 150° C.

The stack composed of the film A containing the polyimide resin and the film B containing the polysiloxane resin may be produced via a film forming process composed of two steps described below. First, a resin solution containing a polyimide precursor resin is coated onto a substrate as step (1), and then heating is performed as step (3), thereby forming a film A. Then, a polysiloxane resin composition is coated onto the film A as step (2), and heating is performed as step (3) as in the first layer.

The resin stack described above is utilized as a substrate for a display applicable to a color filter, an organic EL element, an on-chip type substrate, an encapsulating resin, a touch panel, a circuit substrate, a liquid crystal panel, a PDP, an electronic paper, a see-through display, etc.

Preferably, the resin stack of the present invention has a coefficient of thermal expansion (CTE) of 40 ppm/° C. or less. This makes it possible not only to reduce the amount of positional shift of BM when producing a color filter but also to suppress generation of cracks in a gas barrier layer when forming the gas barrier layer on the resin stack and, as a result, the display performance of a display can be improved. More preferably, the coefficient of thermal expansion (CTE) is 35 ppm/° C. or less.

The coefficient of thermal expansion as referred to herein means a value determined from the average of coefficients of thermal expansion at 50 to 200° C. obtained by raising the temperature to 150° C. at a temperature raising rate of 5° C./min in the first step to remove the absorbed water of the sample, cooling to room temperature at a temperature lowering rate of 5° C./min in the second step, and performing the plenary measurement at a temperature raising rate of 5° C./min in the third step.

<Color Filter>

When the resin stack is used for a color filter, it is fabricated into a color filter having at least a black matrix and a colored pixel on or over the film B. When the resin stack is used for an organic EL element, it is fabricated into an organic EL element having at least TFT, an electrode, and an organic layer on or over the film B. These each may also have a substrate on the film A side.

A color filter utilizing the substrate for a display of the present invention can be produced via the following steps in addition to the steps (1) to (3) described above:

(4) a step of forming a black matrix on the resin stack;
(5) a step of forming a colored pixel on the resin stack; and
(6) a step of peeling the resin stack from the substrate.

Preferably, the black matrix is a resin black matrix in which a black pigment is dispersed in a resin. Examples of the black pigment include carbon black, titanium black, titanium oxide, titanium oxynitride, titanium nitride, and iron tetraoxide. Especially, carbon black and titanium black are preferred. A red pigment, a green pigment, and a blue pigment can be used as a black pigment by being mixed together.

As the resin to be used for the resin black matrix, a polyimide resin is preferred because it is easy to form a thin pattern. As to the polyimide resin, it is preferred to form the polyimide resin by patterning a polyamic acid synthesized from an acid anhydride and a diamine and then thermally curing it. As the acid anhydride, the diamine, and the solvent, those enumerated for the polyimide resin described above can be used.

As the resin to be used for the resin black matrix, a photosensitive acrylic resin is also preferred. The resin black matrix using this contains an alkali-soluble acrylic resin in which a black pigment is dispersed, a photopolymerizable monomer, a polymer dispersing agent, and an additive.

Examples of the alkali-soluble resin include a copolymer of an unsaturated carboxylic acid with an ethylenically unsaturated compound. Examples of the unsaturated carboxylic acid include acrylic acid, methacrylic acid, itaconic acid, crotonic acid, maleic acid, fumaric acid, vinylacetic acid, and acid anhydrides.

Examples of the photopolymerizable monomer include trimethylolpropane tri(meth)acrylate, pentaerythritol tri (meth)acrylate, triacrylformal, pentaerythritol tetra(meth) acrylate, dipentaerythritol hexa(meth)acrylate, and dipentaerythritol penta(meth)acrylate.

Examples of the photopolymerization initiators include benzophenone, N,N'-tetraethyl-4,4'-diaminobenzophenone, 4-methoxy-4'-dimethylaminobenzophenone, 2,2-diethoxyacetophenone, α-hydroxyisobutylphenone, thioxanthone, and 2-chlorothioxanthone.

Examples of the solvent for dissolving a photosensitive acrylic resin include propylene glycol monomethyl ether acetate, propylene glycol monoethyl ether acetate, ethyl acetoacetate, methyl 3-methoxypropionate, ethyl 3-ethoxypropionate, methoxybutyl acetate, and 3-methyl-3-methoxybutyl acetate.

A black resin composition for a resin black matrix made of a polyamic acid in which a black pigment is dispersed is coated onto the resin film by means of a spin coater, a die coater, or the like such that the film thickness after curing is 1 μm, and dried under reduced pressure to 60 Pa, and then semicuring is performed with a hot air oven or a hot plate at 110 to 140° C.

A resist film is formed by coating a positive working resist such that a film thickness after prebaking becomes 1.2 μm by means of a spin coater, a die coater, or the like, then performing drying under reduced pressure to 80 Pa, and then performing prebaking with a hot air oven or a hot plate at 80 to 110° C. After that, exposure to light is performed selectively with ultraviolet rays via a photomask using a proximity exposer, a projection exposer, or the like, followed by immersion in an alkali developing solution such as 1.5 to 3.0% by weight potassium hydroxide or tetramethylammonium hydroxide for 20 to 300 seconds, and thus exposed portions are removed. After stripping away the positive working resist using a stripper, a polyamic acid is converted into a polyimide by heating with a hot air oven or a hot plate at 200 to 300° C. for 10 to 60 minutes. Thus, a resin black matrix in which a black pigment is dispersed in the resin film is formed. When forming with a photosensitive resin, it is possible to perform exposure to light and development without coating a positive working resist.

After forming the resin black matrix, colored pixels are formed. Generally, the colored pixels are composed of colored pixels of three colors red, green and blue. It is also possible to increase the brightness of white display of a display device by forming a colorless transparent or slightly colored pixel of the fourth color in addition to colored pixels of the three colors.

In the colored pixels of the color filter, a resin containing a pigment or a dye as a coloring agent is used.

Examples of the pigment to be used for a red colored pixel include PR254, PR149, PR166, PR177, PR209, PY138, PY150, and PYP139, examples of the pigment to be used for a green colored pixel include PG7, PG36, PG58, PG37, PB16, PY129, PY138, PY139, PY150, and PY185, and examples of the pigment to be used for a blue colored pixel include PB15:6 and PV23.

Examples of blue dyes include C. I. Basic Blue (BB) 5, BB7, BB9, and BB26, and examples of red dyes include C. I. Acid Red (AR) 51, AR87, and AR289.

While examples of the resin to be used for red, green and blue colored pixels include acrylic resins, epoxy resins, and polyimide resins, photosensitive acrylic resins are preferred because the cost of manufacturing a color filter can be reduced. It is common that a photosensitive acrylic resin contains an alkali-soluble resin, a photopolymerizable monomer, and a photopolymerization initiator.

Examples of the alkali-soluble resin include a copolymer of an unsaturated carboxylic acid with an ethylenically unsaturated compound. Examples of the unsaturated carboxylic acid include acrylic acid, methacrylic acid, itaconic acid, crotonic acid, maleic acid, fumaric acid, vinylacetic acid, and acid anhydrides.

Examples of the photopolymerizable monomer include trimethylolpropane tri(meth)acrylate, pentaerythritol tri(meth)acrylate, triacrylformal, pentaerythritol tetra(meth)acrylate, dipentaerythritol hexa(meth)acrylate, and dipentaerythritol penta(meth)acrylate.

Examples of the photopolymerization initiators include benzophenone, N,N'-tetraethyl-4,4'-diaminobenzophenone, 4-methoxy-4'-dimethylaminobenzophenone, 2,2-diethoxyacetophenone, α-hydroxyisobutylphenone, thioxanthone, and 2-chlorothioxanthone.

Examples of the solvent for dissolving a photosensitive acrylic resin include propylene glycol monomethyl ether acetate, propylene glycol monoethyl ether acetate, ethyl acetoacetate, methyl 3-methoxypropionate, ethyl 3-ethoxypropionate, methoxybutyl acetate, and 3-methyl-3-methoxybutyl acetate.

Colored pixels of a color filter are produced using a coloring agent and a resin. When a pigment is used as a coloring agent, a colored pixel is produced by mixing a polymer dispersing agent and a solvent with the pigment, followed by dispersing treatment, and then adding an alkali-soluble resin, a monomer, a photopolymerization initiator, etc. On the other hand, when using a dye as a coloring agent, a colored pixel is produced by adding a solvent, an alkali-soluble resin, a monomer, a photopolymerization initiator, etc. to the dye. The total solid content in this case is the sum total of the polymer dispersing agent, the alkali-soluble resin and the monomer, which are resin components, and the coloring agent.

A coating film of a coloring agent is formed by coating the resulting coloring agent composition onto a transparent substrate on which a resin black matrix has been formed such that a film thickness after heat treatment becomes a desired thickness of 0.8 to 3.0 μm by means of a spin coater, a die coater, or the like, then performing drying under reduced pressure to 80 Pa, and then performing prebaking with a hot air oven or a hot plate at 80 to 110° C.

Next, exposure to light is performed selectively with ultraviolet rays or the like via a photomask using a proximity exposer, a projection exposer, or the like. Then, unexposed portions are removed by immersion in an alkali developing solution such as 0.02 to 1.0% by weight aqueous potassium hydroxide solution or aqueous tetramethylammonium hydroxide solution for 20 to 300 seconds. The resulting coating film pattern is heat-treated with a hot air oven or a hot plate at 180 to 250° C. for 5 to 40 minutes, and thus a colored pixel is formed. Using coloring agent compositions prepared for every color of colored pixels, a patterning step such as that described above is performed in order for a red colored pixel, a green colored pixel, and a blue colored pixel.

The aforementioned gas barrier film may be formed between the resin film and the black matrix/colored pixel layer.

Moreover, a planarization layer may be provided in the color filter. Examples of the resin to be used for the formation of the planarization layer include an epoxy resin, an acrylic epoxy resin, an acrylic resin, a siloxane resin, and a polyimide resin. The thickness of the planarization layer is preferably a thickness with which the surface becomes flat, and it is more preferably 0.5 to 5.0 μm, even more preferably 1.0 to 3.0 μm.

As to the method for peeling the color filter, it is preferred to make slits on the periphery of the resin stack and then peel.

A color filter utilizing the substrate for a display described above can be produced via the steps described above. The procedure to pattern colored pixels is not particularly limited.

<Organic EL Element>

An organic EL element utilizing the substrate for a display of the present invention can be produced via the following steps in addition to the steps (1) to (3) described above:

(4) a step of forming an organic EL element on the resin stack; and (5) a step of peeling the resin stack from the substrate.

The formation of an organic EL element can be performed as follows, for example. First, on the film B of the resin stack described above is formed a gas barrier film for suppressing the penetration of gas, such as water vapor and oxygen. Examples of preferable gas barrier films include metal oxides containing one or two or more metals selected from silicon, aluminum, magnesium, zinc, zirconium, titanium, yttrium, and tantalum as a main component, metal nitrides of silicon, aluminum and boron, and mixtures thereof. Especially, it is preferred to contain an oxide, nitride, or oxynitride of silicon as a main component from the viewpoints of gas barrier property, transparency, surface smoothness, flexibility, film stress, cost, etc.

Such a gas barrier film can be produced using a vapor phase deposition method to form a film by depositing a material from a vapor phase, such as a sputtering method, a vacuum deposition method, an ion plating method, and a plasma CVD method. Especially, a sputtering method is preferred from the viewpoint that an excellent gas barrier property can be attained.

The thickness of the gas barrier film is preferably 10 to 300 nm, more preferably 30 to 200 nm. In order to obtain high gas barrier properties, a higher temperature for forming a gas barrier film is preferred, and the temperature is preferably 300° C. or more, more preferably 400° C. or more, even more preferably 500° C. or more.

A TFT is formed on the gas barrier film. Examples of a semiconductor layer for forming the TFT include an amorphous silicon semiconductor, a polycrystalline silicon semiconductor, an oxide semiconductor typified by InGaZnO, and an organic semiconductor typified by pentacene and polythiophene. For example, a bottom gate type TFT is produced by forming in order a gas barrier film, a gate electrode, a gate dielectric layer, a polycrystalline silicon semiconductor layer, an etching stopper film, and a source-drain electrode by a method known in the art using the stack of the present invention as a substrate.

Next, a planarization layer is provided on the TFT. Examples of the resin to be used for the formation of the planarization layer include an epoxy resin, an acrylic epoxy resin, an acrylic resin, a polysiloxane resin, and a polyimide resin. Moreover, an electrode and an organic layer are formed on it. Concretely, a first electrode made of Al/ITO or the like and a white organic EL light emitting layer that has a dielectric layer covering an edge of the first electrode and that is composed of a hole injection layer, a hole transporting layer, a light-emitting layer, an electron transporting layer, and an electron injection layer are provided, a second electrode made of ITO or the like is formed, and an encapsulation film is formed. After the production via the step described above, the resin film is peeled off from the substrate, and thus an organic EL element can be obtained.

Moreover, an on-chip type substrate can be produced by forming a color filter on the thus-obtained organic EL element directly by the above-described procedure.

<Device>

The substrate for a display of the present invention can be used for display devices such as a liquid crystal display, an organic EL display, an electronic paper, a PDP display, an LED display, and a see-through display, a color filter, a touch panel, a solar cell, and light-receiving devices such as CMOS. In particular, the substrate for a display of the present invention is used preferably in order to utilize such a display device or light-receiving device as a bendable, flexible device.

An example of the process of manufacturing a flexible device may be one in which a circuit necessary for a display device or a light receiving device is formed on a resin film formed on a substrate and then slits are made, followed by physical peeling as previously described, and thus the resin stack is peeled off from the substrate.

Since the color filter and the organic EL element produced in an aspect of the present invention each contain a flexible resin stack as a substrate, they can be used as a flexible color filter and a flexible organic EL element, respectively. In addition, using such a flexible color filter and a flexible organic EL element, a flexible organic EL display can be produced. For example, a full color flexible display device can be obtained by laminating a light emitting device to a color filter utilizing the flexible substrate of the present invention. In particular, a flexible organic EL display in which an organic EL element and a color filter both utilizing the flexible substrate of the present invention are combined is preferable.

EXAMPLES

The present invention will be described below with reference to examples and the like, but the present invention is not limited by the examples.

(1) Production of Resin Stack (on Glass Substrate) (Measurement of Transmittance)

A polyimide precursor resin solution was spin-coated to a glass substrate (TEMPAX) of 50 mm×50 mm×1.1 mm thickness by using a spin coater MS-A200 produced by Mikasa Co., Ltd. such that the thickness after prebaking at 140° C. for 4 minutes might be the thickness given in Table 1. Then, prebaking treatment at 140° C. for 4 minutes was performed using a hot plate D-SPIN produced by Dainippon Screen Mfg. Co., Ltd. Subsequently, a polysiloxane resin composition was spin-coated likewise by using a spin coater MS-A200 produced by Mikasa Co., Ltd. such that the thickness after prebaking at 100° C. for 2 minutes might be the thickness given in Table 1. The coating film after the prebaking treatment was heated to 300° C. at a rate of 3.5° C./min, held for 30 minutes, and cooled to 50° C. at a rate of 5° C./min under a nitrogen stream (oxygen concentration: 20 ppm or less) using an Inert Gas Oven (INH-21CD produced by Koyo Thermo Systems Co., Ltd.), and thus a resin stack (on a glass substrate) was produced.

(2) Production of Thermally Resistant Resin Film (on Silicon Substrate) (Measurement of Birefringence)

A polyimide precursor resin or a polysiloxane resin composition was spin-coated to a 4-inch silicon substrate cut into ¼ by using a spin coater MS-A200 produced by Mikasa Co., Ltd. such that the thickness after prebaking might be 5±0.5 μm. Then, prebaking treatment was performed using a hot plate D-SPIN produced by Dainippon Screen Mfg. Co., Ltd. (Prebaking was performed at 140° C. for 4 minutes for the polyimide precursor resin and at 100° C. for 2 minutes for the polysiloxane resin composition.) The prebaked film was heated to 300° C. or 350° C. at a rate of 3.5° C./min, held for 30 minutes, and cooled to 50° C. at a rate of 5° C./min under a nitrogen stream (oxygen concentration: 20 ppm or less) using an Inert Gas Oven (INH-21CD produced by Koyo Thermo Systems Co., Ltd.), and thus a thermally resistant resin film (on a silicon substrate) was produced.

(3) Production of Resin Stack (Measurement of TMA)

A polyimide precursor resin solution was spin-coated to a 6-inch silicon substrate by using a coater/developer Mark-7 produced by Tokyo Electoron Ltd. such that the thickness after prebaking at 140° C. for 4 minutes might be the thickness given in Table 1. Then, prebaking treatment at 140° C. for 4 minutes was performed likewise using a hot plate of Mark-7. Subsequently, a polysiloxane resin composition was spin-coated by using a spin coater MS-A200 produced by Mikasa Co., Ltd. such that the thickness after prebaking at 100° C. for 2 minutes might be the thickness given in Table 1. The coating film after the prebaking treatment was heated to 300° C. at a rate of 3.5° C./min, held for 30 minutes, and cooled 50° C. at a rate of 5° C./min under a nitrogen stream (oxygen concentration: 20 ppm or less) by using an Inert Gas Oven (INH-21CD produced by Koyo Thermo Systems Co., Ltd.), and thus a resin stack was produced. Subsequently, the resulting resin stack was slit on its periphery and was immersed in hot water at 65° C. for 1 to 4 minutes, and then the resin stack was pulled to peel off from the substrate and was dried in air.

(4) Measurement of Light Transmittance (T)

A light transmittance at a wavelength of 400 nm was measured using an ultraviolet-visible spectrophotometer (MultiSpec1500 produced by Shimadzu Corporation). For the measurement, the resin stack on a glass substrate produced in (1) was used.

(5) Measurement of Coefficient of Thermal Expansion (CTE)

Measurement was performed by using a thermomechanical analyzer (EXSTAR6000 TMA/SS6000 manufactured by SII NanoTechnology Inc.) under nitrogen flow. The raising of temperature was performed under the following conditions. The temperature was raised up to 150° C. at a temperature raising rate of 5° C./min in the first stage, thereby removing the adsorbed water of the sample, and then the temperature was lowered in the air to room temperature at a temperature lowering rate of 5° C./min in the second stage. In the third stage, the plenary measurement was performed at a temperature raising rate of 5° C./min, and a coefficient of thermal expansion (CTE) was calculated from the average of the coefficients of thermal expansion at 50 to 200° C. The resin stack produced in (3) was used for the measurement and was judged by the following evaluation method.

Excellent (A): 35 ppm/° C. or less
Good (B): more than 35 ppm/° C. and not more than 40 ppm/° C.
Poor (C): more than 40 ppm/° C.

(6) Measurement of Birefringence

Using a prism coupler (PC2010 produced by METRICON), a TE refractive index (n(TE)) and a TM refractive index (n(TM)) at a wavelength of 632.8 nm were measured. n(TE) and n(TM) are a refractive index in a parallel direction and a refractive index in a perpendicular direction, respectively, with respect to the film surface. The birefringence was calculated as the difference between n(TE) and n(TM)) (n(TE)−n(TM)), and the birefringence of the film A was denoted by $\Delta N_A$ and the birefringence of the film B was denoted by $\Delta N_B$. The resin film produced in (2) was used for the measurement.

(7) Measurement of Temperature of 3% Weight Loss (Td3)

The polysiloxane resin film produced in (2) was scraped and about 15 mg of the scrape dust was put into an aluminum cell, and then measurement was performed under a nitrogen stream using a thermogravimetric analyzer (TGA-50 produced by Shimadzu Corporation). The raising of temperature was performed under the following conditions. The temperature was raised up to 150° C. at a temperature raising rate of 3.5° C./min in the first stage, thereby removing the adsorbed water of the sample, and then the temperature was lowered to 40° C. at a temperature lowering rate of 10° C./min in the second stage. In the third stage, the plenary measurement was executed at a temperature raising rate of 10° C./min, and the temperature at which the weight was lost by 3% (Td3) was measured.

(8) Measurement of Chromaticity

The transmitted chromaticity coordinates in the XYZ color system chromaticity diagram of the film B formed on an alkali-free glass (glass thickness: 0.7 mm) were measured using a microspectrophotometer "MCPD-2000" produced by Otsuka Electronics Co., Ltd.

Moreover, a resin stack substrate in which an alkali-free glass (glass thickness: 0.7 mm) was provided on a film A containing a polyimide resin was produced. The C light source (L*a*b*) color space of the resin stack substrate was measured using a microspectrophotometer "MCPD-2000" produced by Otsuka Electronics Co., Ltd., and the transmitted color tone was judged as follows.

A (outstanding: ⊙): The values of a* and b* satisfy 0≤|a*|≤0.5 and 0≤|b*|≤1.0.
B (good: ○): The values of a* and b* satisfy 0≤|a*|≤1.0 and 1.0<|b*|≤1.8.
C (satisfactory: Δ): The value of a* and b* satisfy 0≤|a*|≤1.5 and 1.8<|b*|≤2.5.
D (poor: ×): The values of a* and b* satisfy |a*|>1.5 or |b*|>2.5.

(9) Evaluation of Flex Resistance of Flexible Color Filter

The flex resistance of a flexible color filter was measured in the following procedures. First, a color filter peeled off from a glass substrate was sampled into 100 mm×140 mm, a metal cylinder of 30 mm in diameter was fixed to the center portion of the surface of the sample, the sample was put along the cylinder at a cylinder holding angle of 0° (a state where the sample formed a plane) (see FIG. 1), and a bending operation was repeated 100 times within a range to make a cylinder holding angle of 180° (a state where the sample was folded on the cylinder) (see FIG. 2). The flex resistance was indicated by the presence or absence of crack generation in a film B before and after a bending operation; 100 samples were visually observed after the test using an optical microscope (OPTIPHOT300 produced by Nikon).

(10) Evaluation of the Position Accuracy of Black Matrix (BM)

The amount of positional shift of BM from its ideal lattice in a color filter with a glass substrate was measured in the following manner using SMIC-800 (manufactured by Sokkia Topcon Co., Ltd.). First, a BM pattern was formed on a glass substrate in the same manner as described in Example 1[2] except that the forming site was on the glass substrate. At 24 sites of the BM pattern, the amount of positional shift from the ideal lattice was measured. Next, at 24 sites of the BM pattern in the color filter obtained in each of the examples and the comparative examples, the amount of positional shift from the ideal lattice was measured. In each measurement, an average of the absolute values of the measured amounts of positional shift was calculated and the calculated value was taken as the amount of positional shift from the ideal lattice of BM in that level. While the value of the amount of positional shift in each of the examples and the comparative examples was evaluated, and how large the difference in the amount of positional shift was between the case where a BM pattern was produced on a glass substrate and the case where a BM pattern was formed on a resin stack was evaluated, and judgment was made by the following evaluation method.

Excellent (A): The amount of BM positional shift is 1.8 µM or less.

Good (B): The amount of BM positional shift is more than 1.8 µm and not more than 2.4 µm.

Poor (C): The amount of BM positional shift is more than 2.4 µm.

(11) Measurement of Light Emission Efficiency

The current efficiencies (cd/A) at a brightness of 1000 cd/m² in an organic EL element immediately after production, an organic EL element after a high humidity/high temperature test, and an organic EL element after a high humidity/high temperature test following a bending test were measured. The bending test was performed by sampling an organic EL element peeled off from a glass substrate into 100 mm×140 mm, fixing a metal cylinder of 30 mm in diameter to the center portion of the surface of the sample, putting the sample along the cylinder at a cylinder holding angle of 0° (a state where the sample formed a plane) (see FIG. 1), and bending the sample 100 times within a range to make a cylinder holding angle of 180° (a state where the sample was folded on the cylinder) (see FIG. 2). The high humidity/high temperature test was performed by putting an organic EL element peeled off from a glass substrate in a high humidity/high temperature chamber having an internal temperature of 85° C. and a humidity of 85% for 24 hours.

Synthesis Example 1: Synthesis of Transparent Polyimide Precursor Resin Solution (I)

Under a stream of dry nitrogen, 16.66 g (53.7 mmol) of 4,4'-oxydiphthalic anhydride (ODPA), 32.46 g (53.7 mmol) of 2,2'-bis[3-(3-aminobenzamido)-4-hydroxyphenyl] hexafluoropropane (HFHA) and 100 g of N-methyl-2-pyrrolidone were charged into a 200 mL four-neck flask, and then heated and stirred at 65° C. After 6 hours, cooling afforded a transparent polyimide precursor resin solution (I).

Synthesis Example 2: Synthesis of Transparent Polyimide Precursor Resin Solution (II)

Under a stream of dry nitrogen, 11.53 g (39.2 mmol) of 3,3',4,4'-biphenyltetracarboxylic dianhydride (BPDA), 1.92 g (9.79 mmol) of 1,2,3,4-cyclobutanetetracarboxylic dianhydride (CBDA), 5.59 g (49.0 mmol) of trans-1,4-diaminocyclohexane (CHDA), and 100 g of N-methyl-2-pyrrolidone were charged into a 200 mL four-neck flask, and then heated and stirred at 65° C. After 6 hours, cooling afforded a transparent polyimide precursor resin solution (II).

Synthesis Example 3: Synthesis of Transparent Polyimide Precursor Resin Solution (III)

Under a stream of dry nitrogen, 7.90 g (26.4 mmol) of 3,3',4,4'-biphenyltetracarboxylic dianhydride (BPDA), 14.01 g (26.4 mmol) of 2,2-bis(4-(3,4-dicarboxyphenoxy) phenyl)propane dianhydride (BSAA), 6.1375 g (53.7 mmol) of trans-1,4-diaminocyclohexane (CHDA), and 100 g of N-methyl-2-pyrrolidone were charged into a 200 mL four-neck flask, and then heated and stirred at 65° C. After 6 hours, cooling afforded a transparent polyimide precursor resin solution (III).

Synthesis Example 4: Synthesis of Transparent Polyimide Precursor Resin Solution (IV)

Under a stream of dry nitrogen, 13.72 g (46.6 mmol) of 3,3',4,4'-biphenyltetracarboxylic dianhydride (BPDA), 5.33 g (46.6 mmol) of trans-1,4-diaminocyclohexane (CHDA), and 100 g of N-methyl-2-pyrrolidone were charged into a 200 mL four-neck flask, and then heated and stirred at 65° C. After 6 hours, cooling afforded a transparent polyimide precursor resin solution (IV).

Synthesis Example 5: Synthesis of Transparent Polyimide Precursor Resin Solution (V)

Under a stream of dry nitrogen, 7.23 g (36.9 mmol) of 1,2,3,4-cyclobutanetetracarboxylic dianhydride (CBDA), 11.81 g (36.9 mmol) of 2,2'-bis(trifluoromethyl)benzidine (TFMB), and 100 g of N-methyl-2-pyrrolidone were charged into a 200 mL four-neck flask, and then heated and stirred at 65° C. After 6 hours, cooling afforded a transparent polyimide precursor resin solution (V).

Synthesis Example 6: Synthesis of Transparent Polyimide Precursor Resin Solution (VI)

Under a stream of dry nitrogen, 12.04 g (53.7 mmol) of 1,2,4,5-cyclohexanetetracarboxylic dianhydride (PMDA-HS), 32.46 g (53.7 mmol) of 2,2-bis[3-(3-aminobenzamido)-4-hydroxyphenyl]hexafluoropropane (HFHA) and 100 g of N-methyl-2-pyrrolidone were charged into a 200 mL four-neck flask, and then heated and stirred at 65° C. After 6 hours, cooling afforded a transparent polyimide precursor resin solution (VI).

Synthesis Example 7: Synthesis of Polyimide Precursor Resin Solution (VII)

Under a stream of dry nitrogen, 7.03 g (32.2 mmol) of pyromellitic anhydride (PMDA), 6.32 g (21.5 mmol) of 4,4'-biphthalic anhydride (BPDA), 5.81 g (53.7 mmol) of 1,4-phenylenediamine (PDA), and 100 g of N-methyl-2-pyrrolidone were charged into a 200 mL four-neck flask, and then heated and stirred at 65° C. After 6 hours, cooling afforded a polyimide precursor resin solution (VII).

Synthesis Example 8: Synthesis of Polyimide Precursor Resin Solution (VIII)

Under a stream of dry nitrogen, 10.21 g (34.7 mmol) of 4,4'-biphthalic anhydride (BPDA), 1.59 g (13.9 mmol) of trans-1,4-diaminocyclohexane (CHDA), 7.26 g (20.8 mmol) of 9,9-bis(4-aminophenyl)fluorene (FDA), and 100 g of N-methyl-2-pyrrolidone were charged into a 200 mL four-neck flask, and then heated and stirred at 65° C. After 6 hours, cooling afforded a polyimide precursor resin solution (VIII).

Synthesis Example 9: Synthesis of Polyimide Precursor Resin Solution (VIIII)

Under a stream of dry nitrogen, 60.07 g (300.0 mmol) of 4,4'-diaminophenyl ether (ODA), 70.33 g (650.4 mmol) of 1,4-phenylenediamine (PDA), and 12.43 g (50.0 mmol) of 1,3-bis(3-aminopropyl)tetramethyldisiloxane were charged together with 850 g of γ-butyrolactone and 850 g of N-methyl-2-pyrrolidone, and then 309.43 g (997.5 mmol) of 3,3',4,4'-oxydiphthalic dianhydride (ODPA) was added and allowed to react at 80° C. for 3 hours. Then, 1.96 g (20.0 mmol) of maleic anhydride was added thereto and allowed to further react at 80° C. for 1 hour, and thus a polyimide precursor resin solution (VIIII) was obtained.

Synthesis Example 10: Synthesis of Polysiloxane Resin Solution (I)

Into a 500 ml three-neck flask were charged 46.05 g (0.34 mol) of methyltrimethoxysilane, 83.79 g (0.42 mol) of phenyltrimethoxysilane, 20.82 g (0.08 mol) of 2-(3,4-epoxycyclohexyl)ethyltrimethoxysilane, 151.68136.51 g of propylene glycol monomethyl ether acetate (PGMEA), and 15.17 g of methanol, and under stirring at room temperature, an aqueous phosphoric acid solution prepared by dissolving 0.45 g (0.3% by weight relative to the monomers charged) of phosphoric acid in 47.21 g (a theoretical amount necessary for hydrolysis) of water was added over 10 minutes using a dropping funnel. Then, the flask was soaked in an oil bath at 40° C., followed by stirring for 30 minutes, and then the temperature of the oil bath was raised to 115° C. over 30 minutes. One hour after the beginning of the temperature raising, the internal temperature of the solution arrived at 100° C., and the solution was heated and stirred thereafter for 2 hours (the internal temperature was in a range of 100 to 110° C.), and thus a polysiloxane solution (I) was obtained. Nitrogen was made to flow at a rate of 0.05 l (liter)/min during the heating and stirring. During the reaction, methanol and water, which are by-products, and the solvent distilled in a total amount of 105 g. To the resulting PGMEA solution of polysiloxane was added PGMEA such that the polymer concentration might be 40 wt %, and thus a polysiloxane solution (I) was obtained (Mw=5500 in terms of polystyrene). A solid concentration was determined by weighing 1 g of the polysiloxane resin solution in an aluminum cup, heating it at 250° C. for 30 minutes using a hot plate to evaporate liquid components, and weighing the solid remaining in the aluminum cup after heating. A weight average molecular weight was determined in terms of polystyrene using a GPC (a 410 RI detector produced by Waters; fluidized bed: tetrahydrofuran).

Synthesis Example 11: Synthesis of Polysiloxane Resin Solution (II)

Into a 500 ml flask were charged 47.67 g (0.35 mol) of methyltrimethoxysilyl, 39.66 g (0.20 mol) of phenyltrimethoxysilane, 82.04 g (0.35 mol) of γ-acryloylpropyltrimethoxysilane, 26.23 g (0.1 mol) of 3-trimethoxysilylpropylsuccinic anhydride, and 195.6 g of diacetone alcohol (DAA), and while stirring in an oil bath at 40° C., an aqueous phosphoric acid solution prepared by dissolving 0.39 g of phosphoric acid (0.2 parts by weight relative to the monomers charged) in 55.8 g of water (a theoretical amount necessary for hydrolysis) was added over 10 minutes using a dropping funnel. After stirring at 40° C. for 1 hour, stirring was performed while setting the oil bath temperature at 70° C., and then the temperature of the oil bath was raised to 115° C. over 30 minutes. One hour after the beginning of the temperature raising, the internal temperature of the solution arrived at 100° C., and the solution was heated and stirred thereafter for 2 hours (the internal temperature was in a range of 100 to 110° C.). During the reaction, methanol and water, which are by-products, were distilled off in a total amount of 127 g. To a DAA solution of the resulting polysiloxane resin was added DAA such that the polymer concentration might be 40 wt %, and thus a polysiloxane resin solution (II) was obtained (Mw=4500 (in terms of polystyrene)).

Preparation Example 1: Preparation of Polysiloxane Resin Composition 1

The polysiloxane solution (I) obtained in Synthesis Example 10 (7.42 g), 2.66 g of PMA-ST (produced by Nissan Chemical Industries, Ltd.; a dispersion of silicon dioxide in propylene glycol monomethyl ether acetate; solid concentration=30 wt %) as inorganic oxide particles, 0.01 g of Megaface F-477 (produced by DIC Corporation) as a leveling agent, 4.94 g of PGMEA and 4.80 g of diethylene glycol ethyl methyl ether (EDM) as solvents were mixed and stirred to form a homogeneous solution, which was then filtered through a 0.45 μm filter, and thus a polysiloxane resin composition 1 in which the content of silica particles in the varnish solid was 20 wt % was prepared.

Preparation Example 2: Preparation of Polysiloxane Resin Composition 2

Under yellow light, 1.995 g of PMA-ST (produced by Nissan Chemical Industries, Ltd.; a dispersion of silicon dioxide in propylene glycol monomethyl ether acetate; solid concentration=30 wt %), 0.0898 g of IRGACURE OXE-02 and 0.0299 g of hydroquinone methyl ether (HQME) were added, and dissolved and stirred in 6.00 g of DAA and 1.44 g of PGMEA. To this, 1.257 g of a 50 wt % PGMEA solution of dipentaerythritol hexaacrylate (DPHA), 4.115 g of a polysiloxane solution (II), and 0.075 g of a 1 wt % PGMEA solution of BYK-333 were added individually and stirred. Subsequently, filtration was performed using a 0.45 μm filter to obtain a negative working photosensitive polysiloxane resin composition 2 in which the content of silica particles in the varnish solid was 20 wt %.

Preparation Example 3

Under yellow light, 1.995 g of PMA-ST (produced by Nissan Chemical Industries, Ltd.; a dispersion of silicon dioxide in propylene glycol monomethyl ether acetate; solid concentration=30 wt %), 0.1197 g of IRGACURE OXE-02 and 0.0299 g of hydroquinone methyl ether (HQME) were added, and dissolved and stirred in 6.00 g of DAA and 2.38 g of PGMEA. To this, 0.599 g of a 50 wt % PGMEA solution of dipentaerythritol hexaacrylate (DPHA), 2.24 g of a polysiloxane solution (II), 1.018 g of a 50 wt % PGMEA solution of EPDXYESTER 3002A (produced by Kyoeisha Chemical Co., Ltd.), 0.539 g of a 50 wt % PGMEA solution of M-510 (produced by Toagosei Co., Ltd.), and 0.075 g of a 1 wt % PGMEA solution of BYK-333 were added individually and stirred. Subsequently, filtration was performed using a 0.45 μm filter to obtain a negative working photosensitive polysiloxane resin composition 3 in which the content of silica particles in the varnish solid was 20 wt %.

Preparation Example 4: Production of Black Resin Composition for Forming Black Matrix To 250 g of the polyimide precursor resin solution (VIIII) of Synthesis Example 9 were mixed 50 g of carbon black (MA100; produced by Mitsubishi Chemical Corporation) and 200 g of N-methyl-2-pyrrolidone, and then dispersion treatment at 3200 rpm for 3 hours was performed using zirconia beads of 0.3 mm in diameter by using DYNO-MILL KDL-A, and thus a black resin dispersion liquid was obtained.

To 50 g of this black dispersion liquid were added 49.9 g of N-methyl-2-pyrrolidone and 0.1 g a surfactant (LC951; produced by Kusumoto Chemicals, Ltd.), and thus a non-photosensitive black resin composition was obtained.

Preparation Example 5: Production of Photosensitive Color Resist

Pigment Red PR177 (8.05 g) was charged together with 50 g of 3-methyl-3-methoxybutanol and was dispersed at 7000 rpm for 5 hours using a homogenizer, and then glass beads were removed by filtration. A photosensitive red resist was obtained by adding 134.75 g of a photosensitive acrylic resin solution (AC) having a concentration of 20% by weight prepared by adding 260.00 g of cyclopentanone to 70.00 g of an acrylic copolymer solution ("CYCLOMER" P produced by Daicel Chemical Industries, Ltd., ACA-250, 43 wt % solution), 30.00 g of pentaerythritol tetramethacrylate as a polyfunctional monomer, and 15.00 g of "IRGACURE" 369 as a photopolymerization initiator. Likewise, a photosensitive green resist composed of Pigment Green PG38 and Pigment Yellow PY138, and a photosensitive blue resist composed of Pigment Blue PB15:6 were obtained.

Preparation Example 6: Production of Resin Composition for Forming Transparent Protective Film To 65.05 g of trimellitic acid were added 280 g GBL and 74.95 g of γ-aminopropyltriethoxysilane, followed by heating at 120° C. for 2 hours. To 20 g of the resulting solution were added 7.00 g of bisphenoxyethanol fluorene diglycidyl ether and 15.00 g of diethylene glycol dimethyl ether, and thus a resin composition was obtained.

Preparation Example 7: Preparation of Pigment Dispersion Liquid (d1)

PB15:6 (65 g), 35 g of PV23, 40 g of "BYK2001" produced by byk Chemie as a dispersing agent, and 860 g of propylene glycol monomethyl acetate were subjected to dispersion treatment at 7000 rpm for 30 minutes together with 1000 g of zirconia beads of 0.3 mm in diameter by using a homogenizer, and then the zirconia beads were removed by filtration to obtain a pigment dispersion liquid (d1).

Example 1

Production of Color Filter and Organic EL Element using Substrate for Display (FIG. 3 and FIG. 4)
[1] Production of Resin Stack The transparent polyimide precursor resin solution (I) obtained in Synthesis Example 1 was spin-coated to a glass substrate 1 of 300 mm×400 mm×0.7 mm thickness (AN100 (produced by Asahi Glass Co., Ltd.)) such that the thickness after prebaking at 140° C. for 10 minutes might be 15±0.5 µm. Then, prebaking treatment was performed at 140° C. for 10 minutes using a forced-air dryer. Subsequently, the polysiloxane resin composition 1 obtained in Preparation Example 1 was spin-coated onto a polyimide resin film such that the thickness after prebaking at 100° C. for 2 minutes might be 1.2 µm. Then, prebaking treatment was performed at 100° C. for 2 minutes using a forced-air dryer. Then, heating was performed under a nitrogen stream (oxygen concentration: 20 ppm or less) for 30 minutes using an Inert Gas Oven (INH-21CD produced by Koyo Thermo Systems Co., Ltd.) heated at 300° C., and thus a resin stack composed of a 10 µm film A containing a polyimide resin and a 1 µm film B containing a polysiloxane resin was produced. The visible light transmittance at a wavelength of 400 nm and the CTE of the resulting resin stack were measured and it was found that the transmittance was 87.8% and the CTE was 30 ppm/° C. Moreover, measurement of birefringence, evaluation of flex resistance, measurement of temperature of 3% weight loss, and measurement of chromaticity were performed by the methods described above. The results are shown in Table 1.

[2] Production of Resin Black Matrix

The black resin composition produced in Preparation Example 4 was spin-coated to the film B containing a polysiloxane resin of the stack produced in [1] and then dried with a hot plate at 130° C. for 10 minutes, and thus a black resin coating film was formed. A positive working photoresist ("SRC-100" produced by Shipley Company L.L.C.) was spin-coated, prebaked at 120° C. for 5 minutes with a hot plate, and mask-exposed by UV irradiation at 100 mJ/cm$^2$ (in terms of i-line) using an ultrahigh-pressure mercury lamp. Then, development of the photoresist and etching of the black resin coating film were performed simultaneously using a 2.38% aqueous tetramethylammonium hydroxide solution to form a pattern, then the resist was stripped away with methylcellosolve acetate, and imidization was performed by heating at 280° C. for 10 minutes with a hot plate. Thus, there was formed a resin black matrix in which carbon black was dispersed in the polyimide resin. The thickness of the black matrix was measured and found to be 1.4 µm. The position accuracy of the black matrix was evaluated by the method previously described and it was found that the amount of BM positional shift was 1.7 µm.

[3] Production of Colored Layer

To the resin stack with a pattern processed black matrix produced in [1] and [2], the photosensitive red resist prepared in Preparation Example 5 was spin-coated such that the thickness at a black matrix opening after heat treatment might be 2.0 µm, and then prebaked at 100° C. for 10 minutes with a hot plate, and thus a red colored layer was obtained. Then, using an ultraviolet exposer "PLA-5011" manufactured by Canon Inc., the black matrix opening and a limited area on the black matrix were exposed to light at 100 mJ/cm$^2$ (in terms of i-line) through a photomask made of chromium through which light penetrates in islands. After the exposure, development was performed by immersion in a developing solution of a 0.2% aqueous tetramethylammonium hydroxide solution, followed by washing with pure water, and then heat treatment was performed for 30 minutes in an oven at 230° C., and thus a red pixel 7R was produced. In a similar manner, a green pixel 7G made of the photosensitive green resist prepared in Preparation Example 4 and a blue pixel 7B made of a photosensitive blue resist were produced, so that a color filter (FIG. 3) was obtained. Subsequently, the resin composition prepared in Preparation Example 6 was coated while adjusting the rotation speed of a spinner such that the thickness at a colored layer part after heat treatment might be 2.5 µm. Then, it was heat-treated for 30 minutes in an oven at 230° C., and thus an overcoat layer was produced.

[4] Production of TFT Substrate

On the film B containing a polysiloxane resin of the resin stack (on a glass substrate) produced by the method [1], an inorganic gas barrier film made of SiO was formed using a plasma CVD method. Then, a bottom gate type TFT was formed and a dielectric layer made of $Si_3N_4$ was formed with the TFT covered therewith. Subsequently, a contact hole was formed in the dielectric layer, and then wiring (1.0 µm in height) connected to the TFT via the contact hole was formed on the dielectric layer. This wiring is one for connecting between TFTs or connecting an organic EL element to be formed in a later step and a TFT.

Moreover, in order to flatten irregularities formed by the formation of the wiring, there was formed a planarization layer on the dielectric layer with the irregularities embedded therewith. The formation of the planarization layer was performed by spin-coating a photosensitive polyimide varnish to the substrate, prebaking (at 120° C. for 3 minutes) on a hot plate, and then exposing and developing through a mask with a desired pattern, and heat-treating at 230° C. for 60 minutes under an air flow. The spreadability at the time of coating the varnish was good, and no generating of wrinkles or cracks was observed in the planarization layer resulting from the exposure, development, and heat treatment. Moreover, the average step height of the wiring was 500 nm, a square contact hole of 5 μm on each side was formed in the planarization layer formed, and the planarization layer was about 2 μm thick.

[5] Production of White Light Emitting Type Organic EL Element (FIG. 4)

A top emission type organic EL element was formed on the planarization layer of the TFT obtained in the method described above. First, a first electrode made of Al/ITO (Al: reflecting electrode) was formed on the planarization layer via the contact hole in contact with the wiring. Then, a resist was coated, prebaked, and exposed to light via a desired patterned mask to develop. Using the resist pattern as a mask, pattern processing of the first electrode was performed by wet etching with an ITO etchant. Then, the resist pattern was stripped away using a resist stripper (a mixture liquid of monoethanolamine and diethylene glycol monobutyl ether). The substrate after the stripping was washed with water and then heat-dehydrated at 200° C. for 30 minutes to obtain an electrode substrate with a planarization layer. The change in thickness of the planarization layer was less than 1% after the heat dehydration relative to before the stripper treatment. The thus-obtained first electrode corresponds to an anode of an organic EL element.

Next, an insulation layer shaped to cover an edge of the first electrode was formed. A photosensitive polyimide varnish was likewise used for the insulation layer. Providing the insulation layer can prevent short circuit between the first electrode and a second electrode to be formed in a later step.

Moreover, a white organic EL light emitting layer was provided by vapor-depositing in order a hole transporting layer, an organic light emitting layer, and an electron transporting layer through a desired pattern mask in a vacuum deposition apparatus. Subsequently, the second electrode made of Mg/ITO was formed on the whole upper surface of the substrate. Moreover, an SiON encapsulation film was formed by CVD film formation, and thus an organic EL element (FIG. 4) was obtained.

For the resulting organic EL element, the light emission efficiency was measured using the method previously described and it was found that the light emission efficiency was 5 cd/A both immediately after production and after a high humidity/high temperature test.

Example 2

A resin stack, a color filter, and an organic EL element were produced in the same manner as in Example 1 except that the polyimide precursor resin solution (II) obtained in Synthesis Example 2 was used instead of the polyimide precursor resin solution (I). The visible light transmittance at a wavelength of 400 nm and the CTE of the resin stack were 85.5% and 20 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 3

A resin stack, a color filter, and an organic EL element were produced in the same manner as in Example 1 except that the polyimide precursor resin solution (III) obtained in Synthesis Example 3 was used instead of the polyimide precursor resin solution (I). The visible light transmittance at a wavelength of 400 nm and the CTE of the resin stack were 91.0% and 32 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 4

A resin stack, a color filter, and an organic EL element were produced in the same manner as in Example 1 except that the polyimide precursor resin solution (IV) obtained in Synthesis Example 4 was used instead of the polyimide precursor resin solution (I). The visible light transmittance at a wavelength of 400 nm and the CTE of the resin stack were 86.8% and 9.0 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 5

A resin stack, a color filter, and an organic EL element were produced in the same manner as in Example 1 except that the polyimide precursor resin solution (V) obtained in Synthesis Example 5 was used instead of the polyimide precursor resin solution (I). The visible light transmittance at a wavelength of 400 nm and the CTE of the resin stack were 95.3% and 19 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 6

A resin stack, a color filter, and an organic EL element were produced in the same manner as in Example 1 except that the polyimide precursor resin solution (VI) obtained in Synthesis Example 6 was used instead of the polyimide precursor resin solution (I). The visible light transmittance at a wavelength of 400 nm and the CTE of the resin stack were 96.1% and 29 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 7

A resin stack, a color filter, and an organic EL element were produced in the same manner as in Example 1 except that the polyimide precursor resin solution (VII) obtained in Synthesis Example 7 was used instead of the polyimide precursor resin solution (I). The visible light transmittance at a wavelength of 400 nm and the CTE of the resin stack were 2.4% and 6.0 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 8

A resin stack, a color filter, and an organic EL element were produced in the same manner as in Example 1 except that the polyimide precursor resin solution (VIII) obtained in Synthesis Example 8 was used instead of the polyimide precursor resin solution (I). The visible light transmittance at wavelength of 400 nm and the CTE of the resin stack were 65.2% and 23 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 9

A resin stack, a color filter, and an organic EL element were produced in the same manner as in Example 1 except that the polysiloxane resin composition 2 obtained in Preparation Example 2 was used instead of the polysiloxane resin composition 1, and following the coating and prebaking of the polysiloxane resin composition 2, the film B' was light-cured by exposing the coated film to light on its whole surface with an exposure dose of 150 mJ/cm$^2$ (in terms of i-line) by using an ultraviolet exposer "PLA-5011" manufactured by Canon Inc. and then was developed by immersion in a developing solution consisting of a 0.2% aqueous solution of tetramethylammonium hydroxide for one minute, followed by washing with pure water. The visible light transmittance at a wavelength of 400 nm and the CTE of the resin stack were 87.4% and 30 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 10

A resin stack, a color filter, and an organic EL element were produced in the same manner as in Example 1 except that 0.1 g of a pigment dispersion liquid (d1) was added in Preparation Example 1. The visible light transmittance at a wavelength of 400 nm and the CTE of the resin stack were 87.7% and 30 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 1.

Example 11

A resin stack, a color filter, and an organic EL element were produced in the same manner as in Example 1 except that the thickness of the film A was changed to 20 µm and the thickness of the film B was changed to 3 µm in Example 1. The visible light transmittance at a wavelength of 400 nm and the CTE of the resin stack were 76.3% and 29 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 12

A resin stack, a color filter, and an organic EL element were produced in the same manner as in Example 1 except that the thickness of the film A was changed to 5 µm and the thickness of the film B was changed to 3 µm in Example 1. The visible light transmittance at a wavelength of 400 nm and the CTE of the resin stack were 91.1% and 25 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 13

A resin stack, a color filter, and an organic EL element were produced in the same manner as in Example 1 except that the thickness of the film A was changed to 10 µm and the thickness of the film B was changed to 2.5 µm in Example 1. The visible light transmittance at a wavelength of 400 nm and the CTE of the resin stack were 85.6% and 28 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 14

A resin stack, a color filter, and an organic EL element were produced in the same manner as in Example 1 except that the thickness of the film A was changed to 15 µm and the thickness of the film B was changed to 1.5 µm in Example 1. The visible light transmittance at a wavelength of 400 nm and the CTE of the resin stack were 82.2% and 31 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 15

A resin stack, a color filter, and an organic EL element were produced in the same manner as in Example 1 except that the thickness of the film A was changed to 19 in Example 1. The visible light transmittance at a wavelength of 400 nm and the CTE of the resin stack were 77.1% and 36 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 16

A resin stack, a color filter, and an organic EL element were produced in the same manner as in Example 1 except that the thickness of the film A was changed to 24 in Example 1. The visible light transmittance at a wavelength of 400 nm and the CTE of the resin stack were 75.8% and 38 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 17

A resin stack, a color filter, and an organic EL element were produced in the same manner as in Example 1 except that the polysiloxane resin composition 2 obtained in Preparation Example 3 was used instead of the polysiloxane resin composition 1, and following the coating and prebaking of the polysiloxane resin composition 2, the film B' was light-cured by exposing the coated film to light on its whole surface with an exposure dose of 150 mJ/cm$^2$ (in terms of i-line) by using an ultraviolet exposer "PLA-5011" manufactured by Canon Inc. and then was developed by immersion in a developing solution consisting of a 0.2% aqueous solution of tetramethylammonium hydroxide for one minute, followed by washing with pure water. The visible light transmittance at a wavelength of 400 nm and the CTE of the resin stack were 87.6% and 30 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 18

A resin stack, a color filter, and an organic EL element were produced in the same manner as in Example 1 except that the content of the silica particles in the varnish solid was changed to 65 wt % in Preparation Example 1. The visible light transmittance at a wavelength of 400 nm and the CTE of the resin stack were 88.0% and 29 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 19

A resin stack, a color filter, and an organic EL element were produced in the same manner as in Example 1 except that the content of the silica particles in the varnish solid was changed to 80 wt % in Preparation Example 1. The visible light transmittance at a wavelength of 400 nm and the CTE of the resin stack were 88.1% and 27 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 20

A resin stack, a color filter, and an organic EL element were produced in the same manner as in Example 1 except that TR-513 (produced by JGC Catalysts and Chemicals Ltd.; titanium dioxide-γ-butyrolactone dispersion liquid; solid concentration=30 wt %) was used instead of PMA-ST in Preparation Example 1. The visible light transmittance at a wavelength of 400 nm and the CTE of the resin stack were 83.5% and 36 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 21

A resin stack, a color filter, and an organic EL element were produced in the same manner as in Example 1 except that the thickness of the film B was changed to 0.4 in Example 1. The visible light transmittance at a wavelength of 400 nm and the CTE of the resin stack were 88.5% and 39 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Example 22

A resin stack, a color filter, and an organic EL element were produced in the same manner as in Example 1 except that the content of the silica particles in the varnish solid was changed to 90 wt % in Preparation Example 1. The visible light transmittance at a wavelength of 400 nm and the CTE of the resin stack were 86.2% and 25 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Comparative Example 1

A resin stack, a color filter, and an organic EL element were produced in the same manner as in Example 1 except that the film B was not formed in Example 1. The visible light transmittance at a wavelength of 400 nm and the CTE of the resin stack were 88.0% and 48 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Comparative Example 2

A resin stack, a color filter, and an organic EL element were produced in the same manner as in Example 1 except that PMA-ST was not added in Preparation Example 1. The visible light transmittance at a wavelength of 400 nm and the CTE of the resin stack were 87.7% and 53 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Comparative Example 3

A resin stack, a color filter, and an organic EL element were produced in the same manner as in Example 1 except that the thickness of the film A was changed to 25 μm and the thickness of the film B was changed to 0.5 μm in Example 1. The visible light transmittance at a wavelength of 400 nm and the CTE of the resin stack were 73.4% and 42 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

Comparative Example 4

A resin stack, a color filter, and an organic EL element were produced in the same manner as in Example 1 except that the thickness of the film A was changed to 4.0 μm and the thickness of the film B was changed to 3.0 μm in Example 1. The visible light transmittance at a wavelength of 400 nm and the CTE of the resin stack were 92.1% and 23 ppm/° C., respectively. In addition, the measurement of a birefringence, the evaluation of flex resistance, the measurement of a temperature of 3% weight loss, the measurement of a chromaticity, the evaluation of position accuracy of a black matrix, and the measurement of light emission efficiency were performed in accordance with the methods described above. The results are shown in Table 2.

In Tables 1 and 2 are provided the results of measurement of the transmittance, the CTE, the birefringence, the flex resistance test, and the transmitted chromaticity coordinates of the substrates for displays of Examples 1 to 22 and Comparative Examples 1 to 4, the amount of position shift of BM of the color filters, and the light emission efficiency of the organic EL elements. It is shown that the CTE of a resin stack is reduced without deterioration in transmittance and flex resistance owing to the possession of a film B containing inorganic oxide particulates on a film A, and the position accuracy of BM is improved and the drop of the light emission efficiency of an organic EL element is suppressed when performing a high humidity/high temperature test. In Comparative Example 4, since the thickness ratio of the film B in the stack is large, generation of many cracks was observed when performing the flex resistance test and satisfactory flexibility was not confirmed.

TABLE 1

|  |  |  | Example 1 | Example 2 | Example 3 | Example 4 | Example 5 |
|---|---|---|---|---|---|---|---|
| Resin composition used in layer |  | Film A | Synthesis Example 1 | Synthesis Example 2 | Synthesis Example 3 | Synthesis Example 4 | Synthesis Example 5 |
|  |  | Film B | Synthesis Example 9 | Synthesis Example 9 | Synthesis Example 9 | Synthesis Example 9 | Synthesis Example 9 |
| Content of inorganic particles in Film B [wt %] |  | Silicon dioxide | 20 | 20 | 20 | 20 | 20 |
|  |  | Titanium oxide |  |  |  |  |  |
| Coloring agent contained in Film B |  |  |  |  |  |  |  |
| Thickness of layer |  | Thickness of Film A [μm] | 10 | 10 | 10 | 10 | 10 |
|  |  | Thickness of Film B [μm] | 1 | 1 | 1 | 1 | 1 |
| Evaluation result of substrate for display | Transmittance[% T] |  | 87.8 | 85.5 | 91.0 | 86.8 | 95.3 |
|  | CTE(ppm/° C.) |  | A (30) | A (20) | A (32) | A (9.0) | A (19) |
|  | Birefringence | Birefringence of Film A ($\Delta N_A$) | 0.0085 | 0.0640 | 0.0211 | 0.1174 | 0.0429 |
|  |  | Birefringence of Film B ($\Delta N_B$) | 0.0003 | 0.0003 | 0.0003 | 0.0003 | 0.0003 |
|  |  | $\Delta NA - \Delta NB$ | 0.0082 | 0.0637 | 0.0208 | 0.1171 | 0.0426 |
|  | Transmitted chromaticity coordinate | a* | −0.25 | −0.28 | −0.18 | −0.24 | −0.15 |
|  |  | b* | 1.85 | 1.8 | 1.25 | 1.58 | 1.05 |
|  |  | L* | 97.5 | 96.8 | 98.5 | 97.9 | 99 |
|  |  | Transmitted color tone | ○ | ○ | ○ | ○ | ○ |

TABLE 1-continued

| | | | | | | | |
|---|---|---|---|---|---|---|---|
| Evaluation result of Film B | Temperature of 3% weight loss (Td3) (° C.) | | 350 | 350 | 350 | 350 | 350 |
| | Transmitted chromaticity coordinate | x | 0.315 | 0.315 | 0.315 | 0.315 | 0.315 |
| | | y | 0.321 | 0.321 | 0.321 | 0.321 | 0.321 |
| | | Y | 94 | 94 | 94 | 94 | 94 |
| Evaluation result of color filter | Amount of BM position shift/μm | | A (1.7) | A (1.1) | A (1.8) | A (0.5) | A (1.1) |
| | Flex resistance test (Number of cracks generated in Film B [in 100 sheets]) | | 0 | 0 | 0 | 0 | 0 |
| Evaluation result of organic EL element | Light emission efficiency before high temperature/high humidity test cd/A | | 5 | 5 | 5 | 5 | 5 |
| | Light emission efficiency after high temperature/high humidity test cd/A | | 5 | 5 | 5 | 5 | 5 |
| | Light emission efficiency after high temperature/high humidity test followed by bending test cd/A | | 5 | 5 | 5 | 5 | 5 |

| | | | Example 6 | Example 7 | Example 8 | Example 9 | Example 10 |
|---|---|---|---|---|---|---|---|
| Resin composition used in layer | Film A | | Synthesis Example 6 | Synthesis Example 7 | Synthesis Example 8 | Synthesis Example 1 | Synthesis Example 1 |
| | Film B | | Synthesis Example 9 | Synthesis Example 9 | Synthesis Example 9 | Synthesis Example 10 | Synthesis Example 9 |
| Content of inorganic particles in Film B [wt %] | Silicon dioxide | | 20 | 20 | 20 | 20 | 20 |
| | Titanium oxide | | | | | | |
| Coloring agent contained in Film B | | | | | | | PB15:6/PV23 = 65/35 |
| Thickness of layer | Thickness of Film A [μm] | | 10 | 10 | 10 | 10 | 10 |
| | Thickness of Film B [μm] | | 1 | 1 | 1 | 1 | 1 |
| Evaluation result of substrate for display | Transmittance[% T] | | 96.1 | 2.4 | 65.2 | 87.4 | 87.7 |
| | CTE(ppm/° C.) | | A (29) | A (6.0) | A (23) | A (30) | A (30) |
| | Birefringence | Birefringence of Film A ($\Delta N_A$) | 0.0043 | 0.2100 | 0.0509 | 0.0085 | 0.0085 |
| | | Birefringence of Film B ($\Delta N_B$) | 0.0003 | 0.0003 | 0.0003 | 0.0003 | 0.0003 |
| | | $\Delta N_A - \Delta N_B$ | 0.0040 | 0.2097 | 0.0506 | 0.0082 | 0.0082 |
| | Transmitted chromaticity coordinate | a* | −0.15 | −11.21 | −1.19 | −0.25 | −0.1 |
| | | b* | 1.04 | 46.08 | 2.41 | 1.69 | −0.41 |
| | | L* | 99.1 | 89.2 | 92.1 | 97.5 | 96.8 |
| | Transmitted color tone | | ○ | X | Δ | ○ | ⊙ |
| Evaluation result of Film B | Temperature of 3% weight loss (Td3) (° C.) | | 350 | 350 | 350 | 333 | 331 |
| | Transmitted chromaticity coordinate | x | 0.315 | 0.315 | 0.315 | 0.320 | 0.308 |
| | | y | 0.321 | 0.321 | 0.321 | 0.322 | 0.313 |
| | | Y | 94 | 94 | 94 | 93.7 | 93.5 |
| Evaluation result of color filter | Amount of BM position shift/μm | | A (1.7) | A (0.3) | A (1.4) | A (1.7) | A (1.7) |
| | Flex resistance test (Number of cracks generated in Film B [in 100 sheets]) | | 0 | 0 | 0 | 0 | 0 |
| Evaluation result of organic EL element | Light emission efficiency before high temperature/high humidity test cd/A | | 5 | 5 | 5 | 5 | 5 |
| | Light emission efficiency after high temperature/high humidity test cd/A | | 5 | 5 | 5 | 5 | 5 |
| | Light emission efficiency after high temperature/high humidity test followed by bending test cd/A | | 5 | 5 | 5 | 5 | 5 |

TABLE 2

| | | | Example 11 | Example 12 | Example 13 | Example 14 | Example 15 | Example 16 | Example 17 | Example 18 |
|---|---|---|---|---|---|---|---|---|---|---|
| Resin composition used in layer | Film A | | Synthesis Example 1 | Synthesis Example 1 | Synthesis Example 1 | Synthesis Example 1 | Synthesis Example 1 | Synthesis Example 1 | Synthesis Example 1 | Synthesis Example 1 |
| | Film B | | Synthesis Example 9 | Synthesis Example 9 | Synthesis Example 9 | Synthesis Example 9 | Synthesis Example 9 | Synthesis Example 9 | Synthesis Example 10 | Synthesis Example 9 |
| Content of inorganic particles in Film B [wt %] | Silicon dioxide | | 20 | 20 | 20 | 20 | 20 | 20 | 20 | 65 |
| | Titanium oxide | | | | | | | | | |
| Coloring agent contained in Film B | | | | | | | | | | |
| Thickness of layer | Thickness of Film A [μm] | | 20 | 5 | 10 | 15 | 19 | 24 | 10 | 10 |
| | Thickness of Film B [μm] | | 3 | 3 | 2.5 | 1.5 | 1 | 1 | 1 | 1 |

TABLE 2-continued

| | | | | | | | | | | |
|---|---|---|---|---|---|---|---|---|---|---|
| Evaluation result of substrate for display | Transmittance [% T] | | 76.1 | 91.1 | 85.6 | 82.2 | 77.1 | 75.8 | 87.6 | 88.0 |
| | CTE(ppm/° C.) | | A (29) | A (25) | A (28) | A (31) | B (36) | B (36) | A (30) | A (29) |
| | Birefringence | Birefringence of Film A ($\Delta N_A$) | 0.0085 | 0.0085 | 0.0085 | 0.0085 | 0.0085 | 0.0085 | 0.0085 | 0.0085 |
| | | Birefringence of Film B ($\Delta N_B$) | 0.0003 | 0.0003 | 0.0003 | 0.0003 | 0.0003 | 0.0003 | 0.0002 | 0.0003 |
| | | $\Delta NA - \Delta NB$ | 0.0082 | 0.0082 | 0.0082 | 0.0082 | 0.0082 | 0.0082 | 0.0083 | 0.0082 |
| | Transmitted chromaticity coordinate | a* | −0.15 | −0.08 | −0.26 | −0.2 | −0.63 | −0.72 | −0.28 | −0.25 |
| | | b* | 2.49 | 1.02 | 1.72 | 1.79 | 1.83 | 2.21 | 1.81 | 1.63 |
| | | L* | 96.2 | 98.6 | 96.8 | 96.8 | 96.1 | 94.2 | 97.2 | 97.6 |
| | | Transmitted color tone | △ | ◯ | ◯ | ◯ | △ | △ | △ | ◯ |
| Evaluation result of Film B | Temperature of 3% weight loss (Td3) (° C.) | | 350 | 350 | 350 | 350 | 350 | 350 | 290 | 350 |
| | Transmitted chromaticity coordinate | x | 0.321 | 0.321 | 0.320 | 0.318 | 0.318 | 0.318 | 0.326 | 0.314 |
| | | y | 0.324 | 0.324 | 0.315 | 0.322 | 0.322 | 0.322 | 0.330 | 0.320 |
| | | Y | 87.2 | 87.2 | 53.8 | 91.3 | 91.3 | 91.3 | 93.5 | 94.1 |
| Evaluation result of color filter | Amount of BM position shift/μm | | A (1.7) | A (1.6) | A (1.6) | A (1.7) | B (2.2) | B (2.3) | A (1.4) | A (1.7) |
| | Flex resistance test (Number of cracks generated in Film B [in 100 sheets]) | | 3 | 3 | 0 | 0 | 0 | 0 | 0 | 0 |
| Evaluation result of organic EL element | Light emission efficiency before high temperature/ high humidity test cd/A | | 5 | 5 | 5 | 5 | 5 | 4 | 5 | 5 |
| | Light emission efficiency after high temperature/ high humidity test cd/A | | 5 | 5 | 5 | 5 | 4 | 4 | 4 | 5 |
| | Light emission efficiency after high temperature/ high humidity test followed by bending test cd/A | | 4 | 4 | 5 | 5 | 4 | 4 | 4 | 5 |

| | | | Example 19 | Example 20 | Example 21 | Example 22 | Comparative Example 1 | Comparative Example 2 | Comparative Example 3 | Comparative Example 4 |
|---|---|---|---|---|---|---|---|---|---|---|
| Resin composition used in layer | Film A | | Synthesis Example 1 | Synthesis Example 1 | Synthesis Example 1 | Synthesis Example 1 | Synthesis Example 1 | Synthesis Example 1 | Synthesis Example 1 | Synthesis Example 1 |
| | Film B | | Synthesis Example 9 | Synthesis Example 9 | Synthesis Example 9 | Synthesis Example 9 | — | Synthesis Example 9 | Synthesis Example 9 | Synthesis Example 9 |
| Content of inorganic particles in Film B [wt %] | Silicon dioxide | | 90 | | 20 | 90 | | | 20 | 20 |
| | Titanium oxide | | | 20 | | | | | | |
| Coloring agent contained in Film B | | | | | | | | | | |
| Thickness of layer | Thickness of Film A [μm] | | 10 | 10 | 10 | 10 | 10 | 10 | 25 | 4 |
| | Thickness of Film B [μm] | | 1 | 1 | 0.4 | 1 | 0 | 1 | 0.5 | 3 |
| Evaluation result of substrate for display | Transmittance [% T] | | 88.1 | 83.5 | 88.5 | 86.2 | 88.0 | 87.7 | 73.4 | 92.1 |
| | CTE(ppm/° C.) | | A (27) | B (36) | B (39) | A (25) | C (48) | C (53) | C (42) | A (23) |
| | Birefringence | Birefringence of Film A ($\Delta N_A$) | 0.0085 | 0.0085 | 0.0085 | 0.0085 | 0.0085 | 0.0085 | 0.0085 | 0.0085 |
| | | Birefringence of Film B ($\Delta N_B$) | 0.0003 | 0.0003 | 0.0003 | 0.0003 | — | 0.0004 | 0.0003 | 0.0003 |
| | | $\Delta NA - \Delta NB$ | 0.0082 | 0.0082 | 0.0082 | 0.0082 | — | 0.0081 | 0.0082 | 0.00082 |
| | Transmitted chromaticity coordinate | a* | −0.25 | −0.26 | −0.24 | −0.25 | −0.24 | −0.24 | −0.3 | −0.17 |
| | | b* | 1.62 | 1.71 | 1.6 | 1.62 | 1.59 | 1.59 | 3.37 | 1.21 |
| | | L* | 97.5 | 97 | 97.7 | 97.5 | 97.8 | 97.8 | 95.2 | 98.5 |
| | | Transmitted color tone | ◯ | ◯ | ◯ | ◯ | ◯ | ◯ | X | ◯ |
| Evaluation result of Film B | Temperature of 3% weight loss (Td3) (° C.) | | 350 | 350 | 350 | 350 | — | 350 | 350 | 350 |
| | Transmitted chromaticity coordinate | x | 0.314 | 0.315 | 0.310 | 0.315 | — | 0.315 | 0.310 | 0.815 |
| | | y | 0.319 | 0.324 | 0.317 | 0.321 | — | 0.324 | 0.317 | 0.321 |
| | | Y | 94.1 | 93.5 | 97.5 | 94.4 | — | 93.5 | 97 | 94 |
| Evaluation result of color filter | Amount of BM position shift/μm | | A (1.6) | B (2.2) | B (2.3) | A (1.4) | C (2.8) | C (3.1) | C (2.5) | A (1.3) |
| | Flex resistance test (Number of cracks generated in Film B [in 100 sheets]) | | 2 | 0 | 0 | 6 | — | 0 | 0 | 30 |
| Evaluation result of organic | Light emission efficiency before high temperature/ high humidity test cd/A | | 5 | 5 | 5 | 5 | 5 | 5 | 5 | 5 |

TABLE 2-continued

| EL element | Light emission efficiency after high temperature/high humidity test cd/A | 4 | 4 | 4 | 5 | 2 | 2 | 3 | 5 |
| | Light emission efficiency after high temperature/high humidity test followed by bending test cd/A | 4 | 4 | 4 | 3 | 2 | 2 | 3 | 2 |

Example 23

Production of Organic EL Display (FIG. 5)

[1] Production of Color Filter with Glass Substrate, and White Light Emitting Type Organic EL Element A color filter and a white light emitting type organic EL element were produced each on a glass substrate using the method described in Example 1.

[2] Production of Organic EL Display

The color filter with a glass substrate and the white light emitting type organic EL element with a glass substrate both obtained in the above [1] were laminated together via an adhesive layer. Subsequently, the color filter and the white light emitting type organic EL element were peeled away from the glass substrate by applying an excimer laser (wavelength: 308 nm) from the glass substrate side. Then, a circular polarizing film was stuck on the film A of the color filter to produce an organic EL display (FIG. 5).

Example 24

An organic EL display was produced in the same manner as in Example 23 except that the color filter produced in Example 10 was used.

Example 25

An organic EL display was produced in the same manner as in Example 23 except that the color filter produced in Example 4 was used.

Example 26

An organic EL display was produced in the same manner as in Example 23 except that the color filter produced in Example 8 was used.

Reference Example 1: Production of Polyimide Resin Film

The polyimide precursor resin solution (III) obtained in Synthesis Example 7 was spin-coated to a glass substrate 1 of 300 mm×400 mm×0.7 mm thickness (AN100 (produced by Asahi Glass Co., Ltd.)) such that the thickness after prebaking at 140° C. for 10 minutes might be 15±0.5 µm. Then, prebaking treatment was performed at 140° C. for 10 minutes using a forced-air dryer. After the temperature of the substrate lowered to room temperature, heating was performed under a nitrogen stream (oxygen concentration: 20 ppm or less) for 30 minutes using an Inert Gas Oven (INH-21CD produced by Koyo Thermo Systems Co., Ltd.) heated at 300° C., and thus a polyimide resin film was produced. The visible light transmittance at a wavelength of 400 nm and the CTE of the resulting resin film were measured and it was found that the transmittance was 2.5% and the CTE was 6 ppm/° C.

Example 27

Production of Organic EL Display

[1] Production of Color Filter with Glass Substrate

A color filter was produced on a glass substrate using the method described in Example 1.

[2] Production of White Light Emitting Type Organic EL Element with Glass Substrate (1) Production of Polyimide Resin Film A resin film was produced on a glass substrate using the method described in Reference Example 1.

(2) Production of Substrate for TFT

A substrate for TFT was produced in the same manner as in [4] of Example 1 on the polyimide resin film produced in the above [1].

(3) Production of White Light Emitting Type Organic EL Element

A white light emitting type organic EL element was produced in the same manner as in [5] of Example 1 on the TFT substrate produced in the above (2).

[3] Production of Organic EL Display

The color filter with a glass substrate obtained in the above [1] and the white light emitting type organic EL element with a glass substrate obtained in [2] were laminated together via an adhesive layer. Subsequently, the color filter and the white light emitting type organic EL element were peeled away from the glass substrate by applying an excimer laser (wavelength: 308 nm) from the glass substrate side, and thus an organic EL display was produced.

Example 28

An organic EL display was produced in the same manner as in Example 23 except that the color filter produced in Example 16 was used.

Example 29

An organic EL display was produced in the same manner as in Example 23 except that the color filter produced in Example 20 was used.

Comparative Example 5

An organic EL display was produced in the same manner as in Example 23 except that the color filter produced in Comparative Example 1 was used.

Comparative Example 6

An organic EL display was produced in the same manner as in Example 23 except that the white light emitting type organic EL element produced in Comparative Example 1 was used.

The following evaluations were performed for the displays of Examples and Comparative Examples. The results are shown in Table 3.

(Evaluation of Visibility of Organic EL Display)

The color tone produced when causing an organic EL display to display white color was observed visually, and the visibility was judged as follows.

Excellent (A): It looks white.
Good (B): It looks slightly colored, but looks unobtrusively white.
Poor (C): It is apparently colored and it cannot be said to be white.

(Evaluation of Performance of Organic EL Display to Suppress Ambient Light Reflection)

For the displays of Examples and Comparative Examples, voltage was applied via a driving circuit and the visibility of a display observed outside on a sunny day was checked.

Excellent (A): Ambient light reflection is suppressed sufficiently and the visibility is excellent.
Good (B): The effect to reduce ambient light reflection is reduced a little, but the visibility is good.
Poor (C): Ambient light reflection is not reduced and the visibility is poor.

(Evaluation of Display Performance of Organic EL Display)

For the displays of Examples and Comparative Examples, voltage was applied via a driving circuit and the clarity and the contrast of a display were checked.

Excellent (A): A display that is clear and excellent in contrast.
Good (B): A display that is unsatisfactory in clarity but is generally good in display performance.
Poor (C): A display that has many defects and is poor in display performance.

accuracy of the color filter. In the organic EL display of Comparative Example 6, degradation and defects were observed in its white light emitting element and it was a display poor in clarity. In Comparative Examples 5 and 6, many defects were observed, so that visibility (color, effect to reduce ambient light reflection) was not able to be checked.

REFERENCE SIGNS LIST

1 Metal cylinder
2 Flexible color filter
3 Glass substrate
4 Film A
5 Film B
6 Black matrix
7R Red pixel
7G Green pixel
7B Blue pixel
8 Overcoat layer
9 Planarization layer
10 First electrode
11 Insulation layer
12 White EL element
13 Second electrodes
14 Encapsulant layer
15 TFT layer
16 Gas barrier layer
17 Adhesive layer
18 Circular polarizing film

TABLE 3

|  |  | Example 23 | Example 24 | Example 25 | Example 26 | Example 27 | Example 28 | Example 29 | Comparative Example 5 | Comparative Example 6 |
|---|---|---|---|---|---|---|---|---|---|---|
| Color filter |  | Example 1 | Example 10 | Example 4 | Example 8 | Example 1 | Example 16 | Example 20 | Comparative Example 1 | Example 1 |
| Organic EL element |  | Example 1 | Example 1 | Example 1 | Example 1 | Referential Example 1 | Example 1 | Example 1 | Example 1 | Comparative Example 1 |
| Display | Visibility (Color) | ○ | ⊙ | ○ | Δ | ○ | ○ | ○ | — | — |
|  | Visibility (Ambient light reflection reduction) | ○ | ○ | Δ | ○ | ○ | ○ | ○ | — | — |
|  | Display performance | ○ | ○ | ○ | ○ | ○ | Δ | Δ | X | X |

The organic EL displays of Examples 23, 24 and 27 were small in position shift of a color filter and degradation of the organic EL elements was not observed, and displays clear and high in contrast were able to be produced. In Example 24, coloration of the substrate for a display was reduced by adjusting the transmitted chromaticity of the resin film to be used for the film B, and a display good in visibility was able to be produced.

In Example 25, the effect to reduce ambient light reflection was poor a little, but a display good in visibility and display performance was able to be produced.

In Examples 28 and 29, defects were found in a part of color filters, but the displays were generally good in display performance.

In Example 26, the clarity was not satisfactory because the transparency of the substrate for a color filter was slightly low, but the display was generally good in display performance.

In the organic EL display of Comparative Example 5, many pixel defects were found because of the poor position 19 Flexible color filter
20 Flexible organic EL element

CITATION LIST

Patent Literature

[PTL 1] JP-A-2005-338394
[PTL 2] JP-A-2012-146905
[PTL 3] JP-A-2008-045054
[PTL 4] JP-A-2010-100674
[PTL 5] JP-A-2013-157228
[PTL 6] JP-A-2011-111596

The invention claimed is:
1. A substrate for a display, the substrate having a film B comprising a polysiloxane resin on only one surface of a film A comprising a polyimide resin, wherein the film B contains inorganic oxide particles therein.

2. The substrate for a display according to claim 1, wherein the thickness ratio of the film A to the film B, film A/film B, is from 25/1 to 1.5/1.

3. The substrate for a display according to claim 1, wherein the coefficient of thermal expansion of the substrate for a display is 40 ppm/° C. or less.

4. The substrate for a display according to claim 1, wherein $(\Delta N_A - \Delta N_B) \leq 0.065$ where the birefringence of the film A is denoted by $\Delta N_A$ and the birefringence of the film B is denoted by $\Delta N_B$.

5. The substrate for a display according to claim 1, wherein the content of the inorganic oxide particles in the film B is 20 to 80% by weight.

6. The substrate for a display according to claim 1, wherein the inorganic oxide particles are silicon dioxide.

7. The substrate for a display according to claim 1, wherein the substrate is transparent.

8. The substrate for a display according to claim 1, wherein the thickness of the film A is 5.0 μm to 20 μm and the thickness of the film B is 0.2 μm to 3.0 μm.

9. The substrate for a display according to claim 1, wherein the polyimide resin has at least one group selected from among a trifluoromethyl group and alicyclic hydrocarbon groups.

10. The substrate for a display according to claim 1, wherein diamine residues having at least one group selected from among a trifluoromethyl group and alicyclic hydrocarbon groups are contained in an amount of 50 mol % or more relative to the total amount of all diamine residues contained in the polyimide resin.

11. The substrate for a display according to claim 1, wherein the polyimide resin is a polyimide comprising at least one of repeating structural units represented by general formulae (1) to (3) as a main component, in formulae (1) to (3), $R^1$ is at least one or more groups represented by (4) to (9)

[Chemical Formula 2]

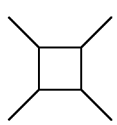

(4)

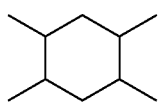

(5)

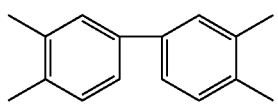

(6)

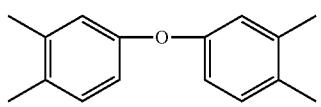

(7)

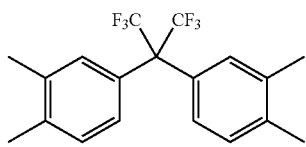

(8)

[Chemical Formula 1]

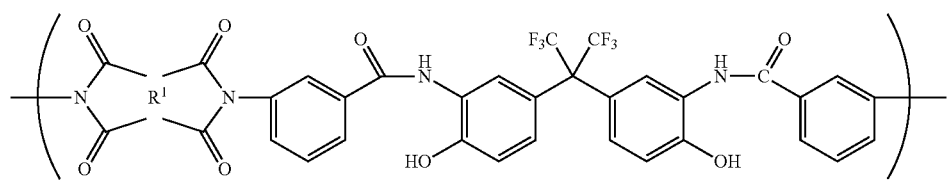

(1)

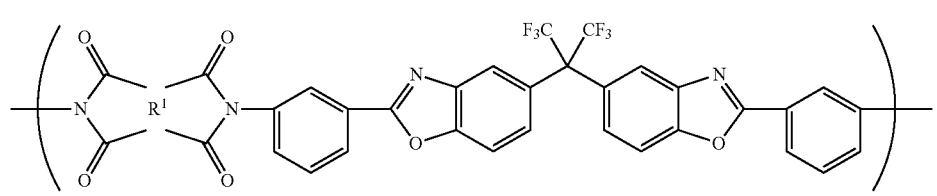

(2)

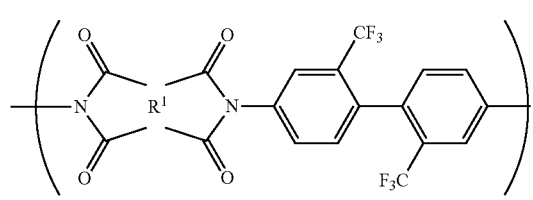

(3)

(9)

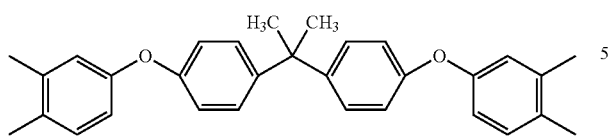

12. The substrate for a display according to claim 1, wherein the polyimide resin is a polyimide comprising repeating structural units represented by general formula (10) as a main component,

[Chemical Formula 3]

(10)

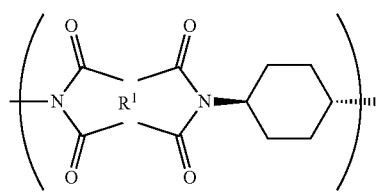

in general formula (10), $R^1$ is at least one or more groups represented by (4) to (9)

[Chemical Formula 4]

(4)

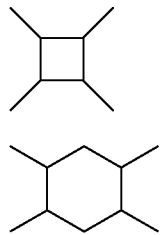

(5)

(6)

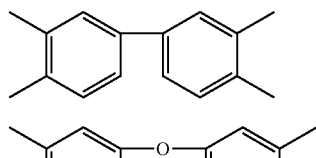

(7)

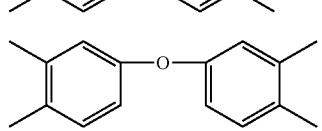

(8)

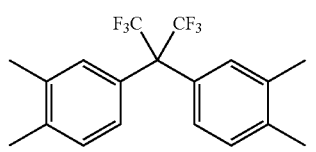

(9)

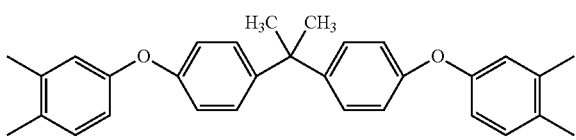

13. The substrate for a display according to claim 1, wherein the temperature of 3% weight loss of the film B is 300° C. or more.

14. The substrate for a display according to claim 1, wherein transmitted chromaticity coordinates in the XYZ color system chromaticity diagram of the film B are within the ranges of 0.300≤x≤0.325 and 0.305≤y≤0.325.

15. A color filter having a black matrix and a colored pixel on or over the film B of the substrate for a display according to claim 1.

16. The color filter according to claim 15 which has a substrate on the film A side of the color filter.

17. An organic EL element having an organic EL element on or over the film B of the substrate for a display according to claim 1.

18. The organic EL element according to claim 17 which has a substrate on the film A side of the organic EL element.

19. A flexible organic EL display comprising a color filter according to claim 15 and/or an organic EL element according to claim 17.

* * * * *